(12) United States Patent
Kim et al.

(10) Patent No.: US 10,903,216 B2
(45) Date of Patent: Jan. 26, 2021

(54) SEMICONDUCTOR MEMORY DEVICE AND METHOD OF FABRICATING THE SAME

(71) Applicant: Samsung Electronics Co., Ltd., Suwon-si (KR)

(72) Inventors: Jiyoung Kim, Yongin-si (KR); Daewon Kim, Seoul (KR); Dongjin Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/520,730

(22) Filed: Jul. 24, 2019

(65) Prior Publication Data

US 2020/0083229 A1    Mar. 12, 2020

(30) Foreign Application Priority Data

Sep. 7, 2018 (KR) .................. 10-2018-0107365
Jan. 31, 2019 (KR) .................. 10-2019-0013052

(51) Int. Cl.
| | |
|---|---|
| *H01L 27/108* | (2006.01) |
| *G11C 5/06* | (2006.01) |
| *G11C 11/408* | (2006.01) |
| *G11C 11/4091* | (2006.01) |
| *G11C 11/4097* | (2006.01) |

(52) U.S. Cl.
CPC ........ *H01L 27/10897* (2013.01); *G11C 5/063* (2013.01); *G11C 11/4085* (2013.01); *G11C 11/4087* (2013.01); *G11C 11/4091* (2013.01); *G11C 11/4097* (2013.01); *H01L 27/10805* (2013.01); *H01L 27/10873* (2013.01); *H01L 27/10885* (2013.01); *H01L 27/10891* (2013.01)

(58) Field of Classification Search
CPC ......... H01L 27/10897; H01L 27/10805; H01L 27/10873; H01L 27/10885; H01L 27/10891; G11C 5/063; G11C 11/4085; G11C 11/4087; G11C 11/4091; G11C 11/4097
USPC ........................................................ 257/296
See application file for complete search history.

(56) References Cited

U.S. PATENT DOCUMENTS

| | | |
|---|---|---|
| 5,453,952 A | 9/1995 | Okudaira et al. |
| 6,746,911 B2 | 6/2004 | Han |
| 7,799,675 B2 | 9/2010 | Lee |
| 7,863,748 B2 | 1/2011 | Oh et al. |
| 7,977,725 B2 | 7/2011 | Yoon et al. |
| 8,058,137 B1 | 11/2011 | Or-Bach et al. |

(Continued)

FOREIGN PATENT DOCUMENTS

KR    100367400 B1    4/2003

*Primary Examiner* — Dzung Tran
(74) *Attorney, Agent, or Firm* — Muir Patent Law, PLLC

(57) ABSTRACT

Disclosed are a semiconductor memory device and a method of fabricating the same. The device may include a first substrate comprising a cell array region, a first interlayer insulating layer covering the first substrate, a second substrate disposed on the first interlayer insulating layer, the second substrate including a core region electrically connected to the cell array region, a first adhesive insulating layer interposed between the first interlayer insulating layer and the second substrate, and contact plugs penetrating the second substrate, the first adhesive insulating layer, and the first interlayer insulating layer and electrically connecting the cell array region with the core region.

20 Claims, 21 Drawing Sheets

(56) References Cited

U.S. PATENT DOCUMENTS

| | | |
|---|---|---|
| 8,120,060 B2 | 2/2012 | Fitzgerald |
| 8,153,499 B2 | 4/2012 | Or-Bach et al. |
| 8,237,228 B2 | 8/2012 | Or-Bach et al. |
| 8,461,035 B1 | 6/2013 | Cronquist et al. |
| 8,513,791 B2 | 8/2013 | Bucki et al. |
| 8,541,819 B1 | 9/2013 | Or-Bach et al. |
| 8,642,416 B2 | 2/2014 | Or-Bach et al. |
| 8,890,228 B2 | 11/2014 | Lee et al. |
| 9,136,153 B2 | 9/2015 | Or-Bach et al. |
| 9,267,986 B2 | 2/2016 | Hashimoto et al. |
| 9,337,198 B2 | 5/2016 | Kwon et al. |
| 9,406,652 B2 | 8/2016 | Ahn et al. |
| 9,425,191 B2 | 8/2016 | Hsiao et al. |
| 9,530,790 B1 | 12/2016 | Lu et al. |
| 9,837,534 B2 | 12/2017 | Yokoyama et al. |
| 9,881,973 B2 | 1/2018 | Redaelli |
| 9,886,275 B1 | 2/2018 | Carlson et al. |
| 9,941,009 B2 | 4/2018 | Lim et al. |
| 2008/0251826 A1 | 10/2008 | Lee et al. |
| 2008/0283891 A1* | 11/2008 | Lee ............... H01L 27/10894 257/301 |
| 2009/0026524 A1* | 1/2009 | Kreupl ............ H01L 25/0657 257/316 |
| 2009/0108318 A1* | 4/2009 | Yoon ............. H01L 27/10817 257/306 |
| 2009/0243115 A1* | 10/2009 | Lee ............... H01L 23/49833 257/773 |
| 2010/0190334 A1 | 7/2010 | Lee |
| 2010/0252894 A1* | 10/2010 | Shim ................. H01L 27/115 257/379 |
| 2014/0061750 A1* | 3/2014 | Kwon ................. G11C 5/025 257/314 |
| 2015/0340316 A1 | 11/2015 | Or-Bach et al. |
| 2018/0240797 A1* | 8/2018 | Yokoyama ........ H01L 23/552 |

\* cited by examiner

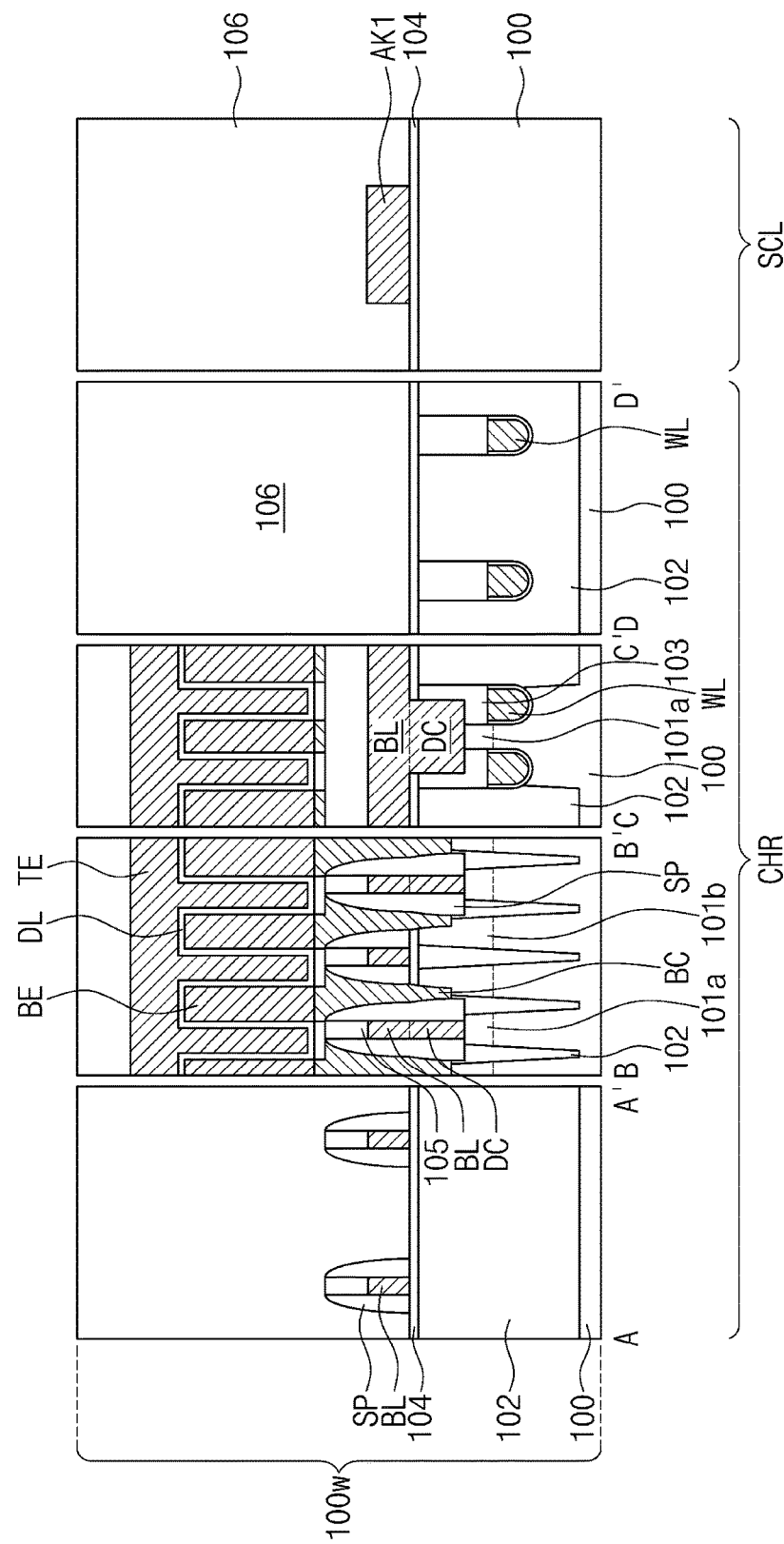

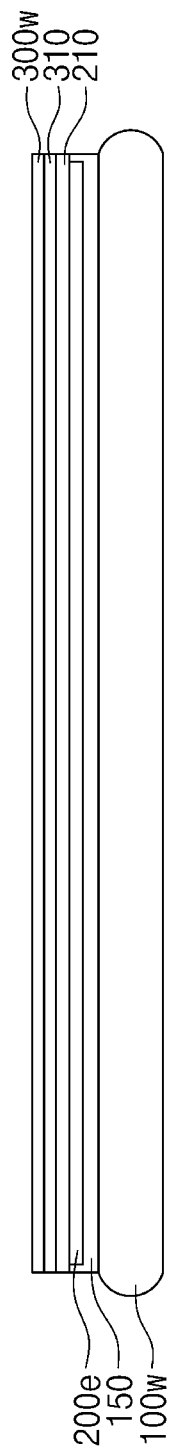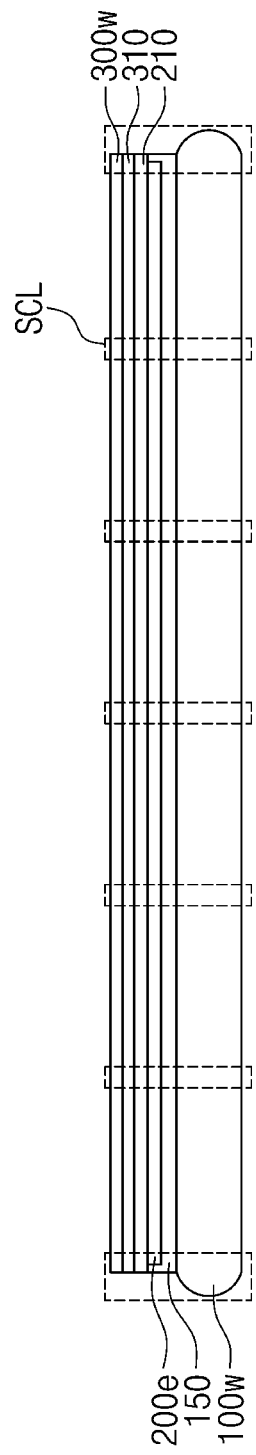

SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application Nos. 10-2018-0107365 and 10-2019-0013052, filed on Sep. 7, 2018 and Jan. 31, 2019, respectively, in the Korean Intellectual Property Office, the entire contents of both of which are hereby incorporated by reference.

BACKGROUND OF THE INVENTION

The present disclosure relates to a semiconductor memory device and a method of fabricating the same.

A semiconductor memory device includes a plurality of circuit regions provided therein. For example, the semiconductor memory device include a cell array region, in which memory elements are provided, and a peripheral region, in which circuits for driving the memory elements and performing a data input/output operation are provided. There is a difference between the cell array region and the peripheral region in terms of technical requirements for electric characteristics. Meantime, in order to meet an increasing demand for a highly integrated semiconductor memory device, it is necessary to form more circuits in a limited chip region. To this end, there is a desire to form a semiconductor memory device having a reduced form factor and being configured to allow devices to have electric characteristics optimized for each region and an improved reliability property.

SUMMARY

An embodiment of the inventive concept provides a semiconductor memory device with improved reliability and an increased integration density.

An embodiment of the inventive concept provides a method of optimizing electric characteristics of devices for each region in a process of fabricating a semiconductor memory device.

According to some embodiments, the disclosure is directed to a semiconductor memory device, comprising: a first substrate comprising a cell array region; a first interlayer insulating layer covering the first substrate; a second substrate disposed on the first interlayer insulating layer, the second substrate comprising a core region electrically connected to the cell array region; a first adhesive insulating layer interposed between the first interlayer insulating layer and the second substrate; and contact plugs penetrating the second substrate, the first adhesive insulating layer, and the first interlayer insulating layer and electrically connecting the cell array region with the core region.

According to some embodiments, the disclosure is directed to a semiconductor device, comprising: a first substrate comprising a cell array region; a second substrate disposed on the first substrate, the second substrate comprising a core region electrically connected to the cell array region; and a third substrate disposed on the second substrate, the third substrate comprising a peripheral circuit region electrically connected to the core region.

According to some embodiments, the disclosure is directed to a semiconductor memory device, comprising: a first substrate comprising a cell array region; a first interlayer insulating layer covering the first substrate; a second substrate disposed on the first interlayer insulating layer, the second substrate comprising a logic region electrically connected to the cell array region; a first adhesive insulating layer interposed between the first interlayer insulating layer and the second substrate; and contact plugs penetrating the second substrate, the first adhesive insulating layer, and the first interlayer insulating layer and electrically connecting the cell array region to the logic region.

According to some embodiments, the disclosure is directed to a method of fabricating a semiconductor memory device, comprising: fabricating a first wafer having chip regions and a scribe lane region; preparing a second wafer; forming a first preliminary adhesive insulating layer on the first wafer; forming a second preliminary adhesive insulating layer on the second wafer; placing the second wafer on the first wafer such that the first preliminary adhesive insulating layer contacts the second preliminary adhesive insulating layer; converting the first preliminary adhesive insulating layer and the second preliminary adhesive insulating layer to an adhesive insulating layer; and forming first transistors and first interconnection lines on the second wafer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A to 6M are sectional views illustrating a process of fabricating a semiconductor memory device (e.g., having the vertical sections of FIG. 4), according to an example embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
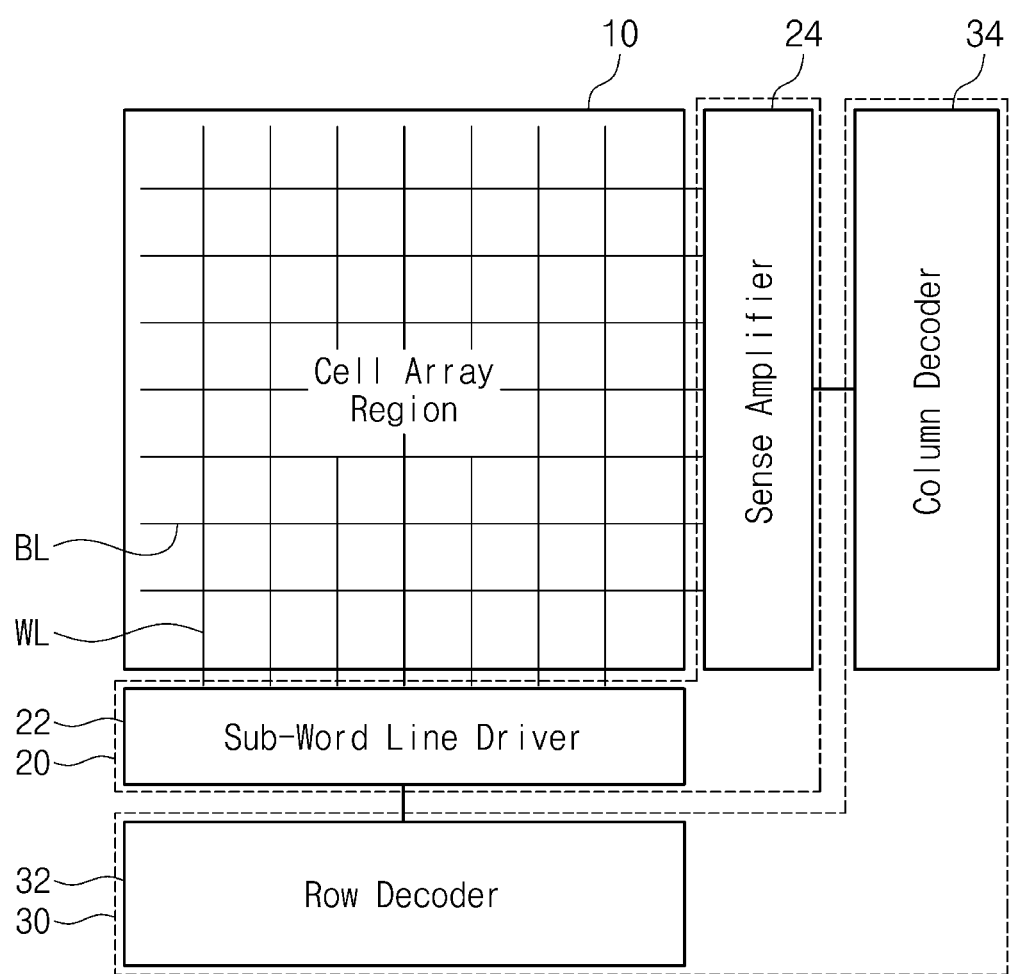
FIG. 1 is a block diagram of a semiconductor memory device, according to an example embodiment of the inventive concept.

FIG. 1 is a block diagram of a semiconductor memory device, according to an example embodiment of the inventive concept.

Referring to FIG. 1, a semiconductor memory device according to an example embodiment may be, for example, a dynamic random access memory (DRAM) device. The semiconductor memory device may include a cell array region 10. Word lines WL and bit lines BL crossing each other may be disposed on the cell array region 10. A core region 20 may be provided around or near the cell array region 10. A sub-word line driver 22 (also referred to as word line driver 22) and a sense amplifier 24 may be placed in the core region 20. A peripheral circuit region 30 may be provided around or near the core region 20. A row decoder 32 and a column decoder 34 may be placed in the peripheral circuit region 30. A region including the core region 20 and the peripheral circuit region 30 may be referred to as a logic region.

The row decoder 32 may decode a row address signal or a refresh address signal. The column decoder 34 may decode a column address signal and may perform a selection operation on the bit line BL. The sub-word line driver 22 may perform an operation of selecting a specific word line from the word lines WL, in response to the row address signal or the refresh address signal. In the case where a cell capacitor of a selected memory cell is configured to store a tiny amount of charges, it may be difficult to directly produce a digital signal, which will be output to the outside, from the charges stored in the cell capacitor. The sense amplifier 24 may perform an operation of amplifying a signal corresponding to the stored charges.

Figure 2:
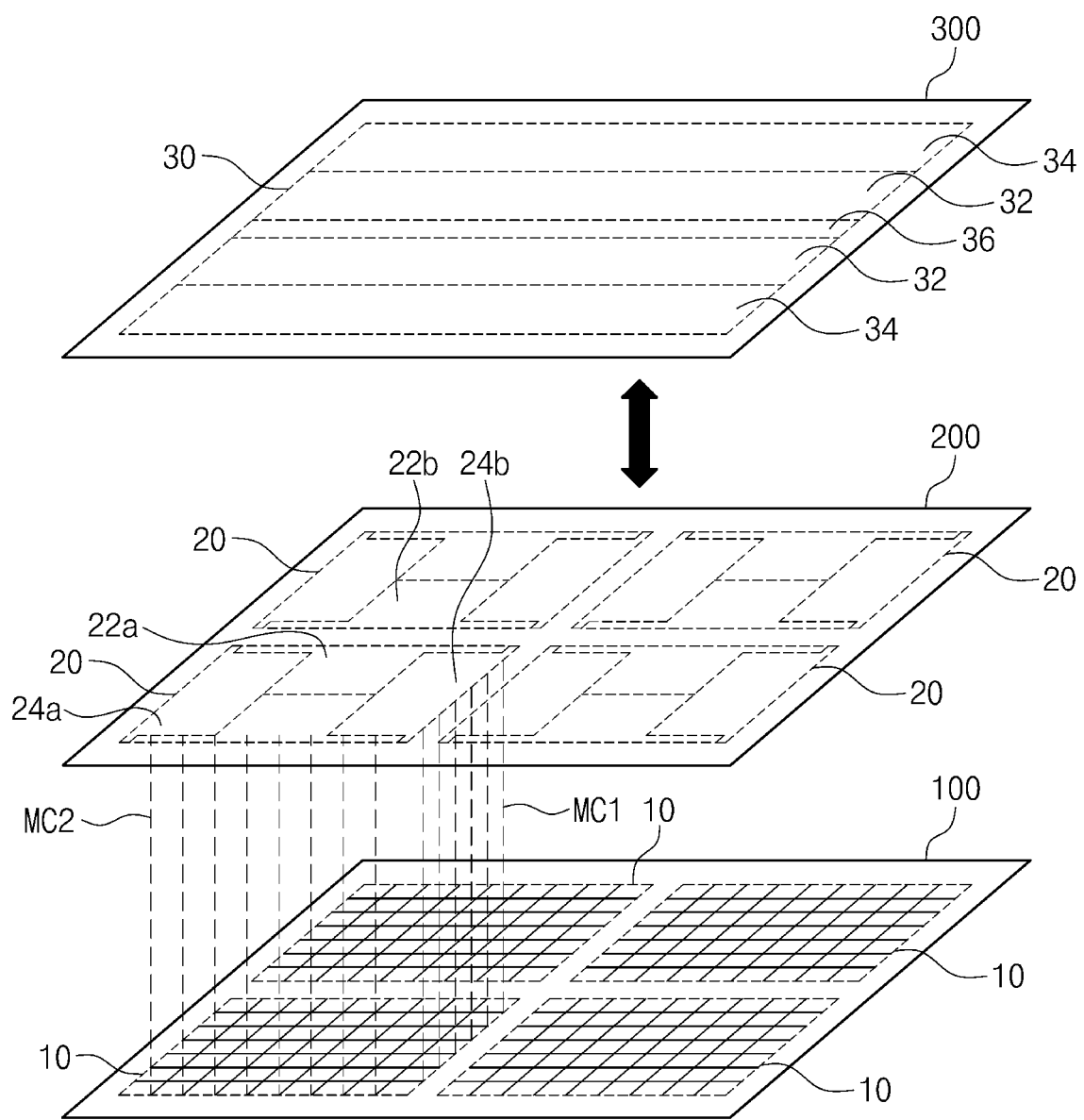
FIG. 2 is a conceptual diagram of a semiconductor memory device, according to an example embodiment of the inventive concept.

FIG. 2 is a conceptual diagram of a semiconductor memory device, according to an example embodiment of the inventive concept.

Referring to FIG. 2, a semiconductor memory device according to the present embodiment may include a first substrate 100, a second substrate 200, and a third substrate 300, which are sequentially stacked. The cell array regions 10, which are spaced apart from each other, may be provided on the first substrate 100. Each of the cell array regions 10 may include a plurality of word lines and a plurality of bit lines crossing the word lines.

The core regions 20 may be placed on the second substrate 200. Each of the core regions 20 may include first and second sub-word line drivers 22a and 22b (also referred to as word line drivers 22a and 22b) and first and second sense amplifiers 24a and 24b. In each of the core regions 20, the first and second sub-word line drivers 22a and 22b may be placed to be symmetric with respect to each other. In each of the core regions 20, the first and second sense amplifiers 24a and 24b may be placed to be symmetric with respect to each other. The first and second sub-word line drivers 22a and 22b may be disposed adjacent to end portions of the word lines disposed on the cell array regions 10. The first and second sense amplifiers 24a and 24b may be disposed adjacent to end portions of the bit lines disposed on the cell array regions 10. In some embodiments, the core regions 20 may vertically overlap the cell array regions 10. For example, when viewed top down, each core region 20 may overlap the cell array region 10 to which the first and second sub-word line drivers 22a and 22b and the first and second sense amplifiers 24a and 24b are connected.

One of the cell array regions 10 may be electrically connected to the core region 20 directly disposed thereon. The end portions of the bit lines on the cell array region 10 may be electrically connected to the first and second sense amplifiers 24a and 24b of the core region 20 through first contact plugs MC1. The end portions of the word lines on the cell array region 10 may be electrically connected to the first and second sub-word line drivers 22a and 22b of the core region 20 through second contact plugs MC2. A height of bottom surfaces of the first contact plugs MC1 may be different from a height of bottom surfaces of the second contact plugs MC2. The height of the bottom surfaces of the first contact plugs MC1 may be higher than the height of the bottom surfaces of the second contact plugs MC2. In some embodiments, the first and second contact plugs MC1 and MC2 may be disposed between the core region 20 and the corresponding cell array region 10. For example, when viewed top down, the first and second contact plugs MC1 and MC2 may be located within boundaries of the corresponding core region 20 and cell array region 10.

The row decoders 32, the column decoders 34, and an input/output terminal region 36 may be provided on the third substrate 300. The first and second sub-word line drivers 22a and 22b, which are included in each of the core regions 20, may be electrically connected to the row decoders 32. The first and second sense amplifiers 24a and 24b, which are included in each of the core regions 20, may be electrically connected to the column decoders 34. Input/output terminals, which are connected to an external device, may be disposed in the input/output terminal region 36.

For convenience in illustration, FIG. 2 illustrates an example of the first substrate 100 including four cell array regions 10, but the number of the cell array regions 10 is not limited thereto. The number of the core regions 20 may be equal to or less than the number of the cell array regions 10.

Figure 3:
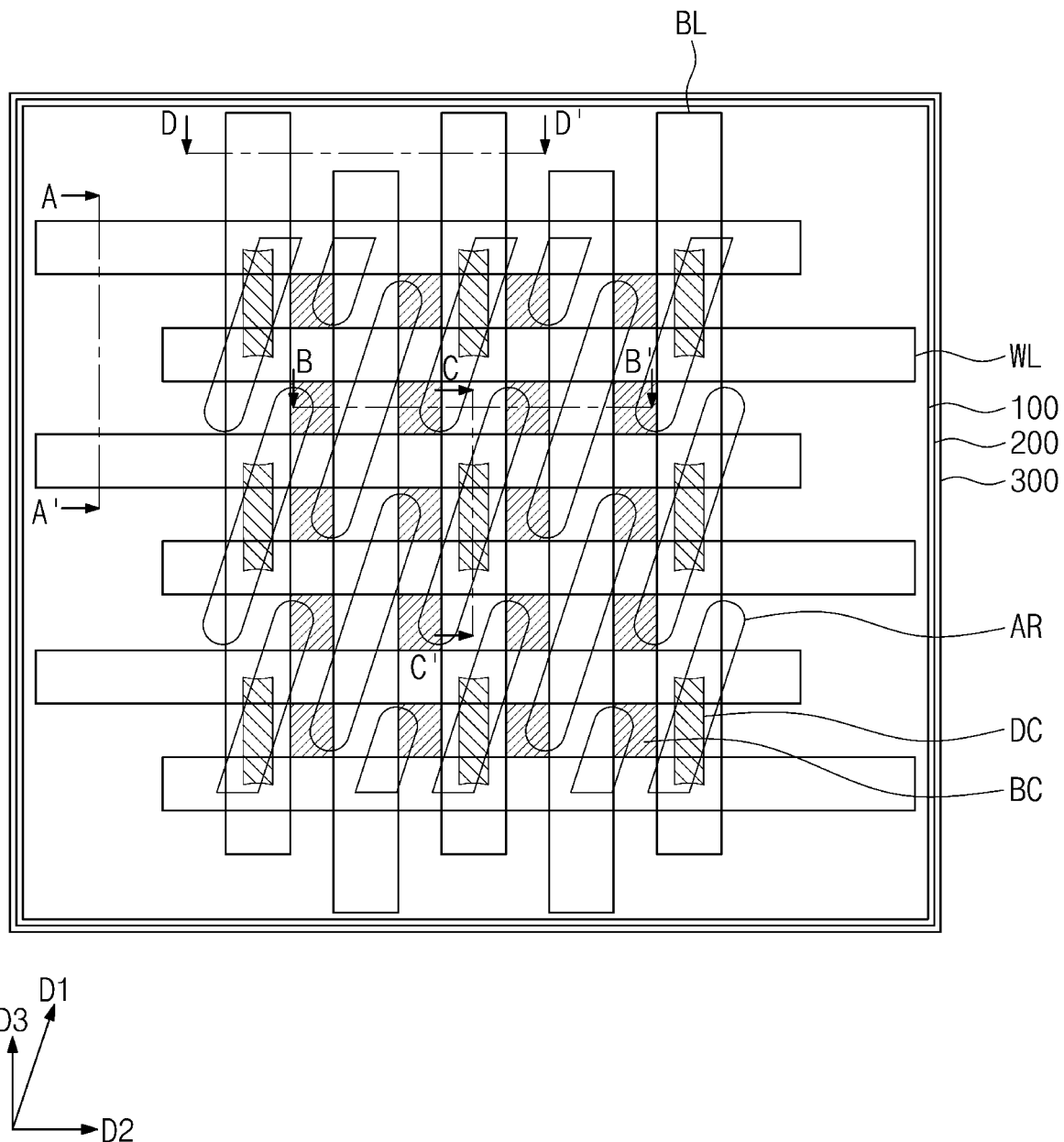
FIG. 3 is a plan view of a semiconductor memory device, according to an example embodiment of the inventive concept.
Figure 4:
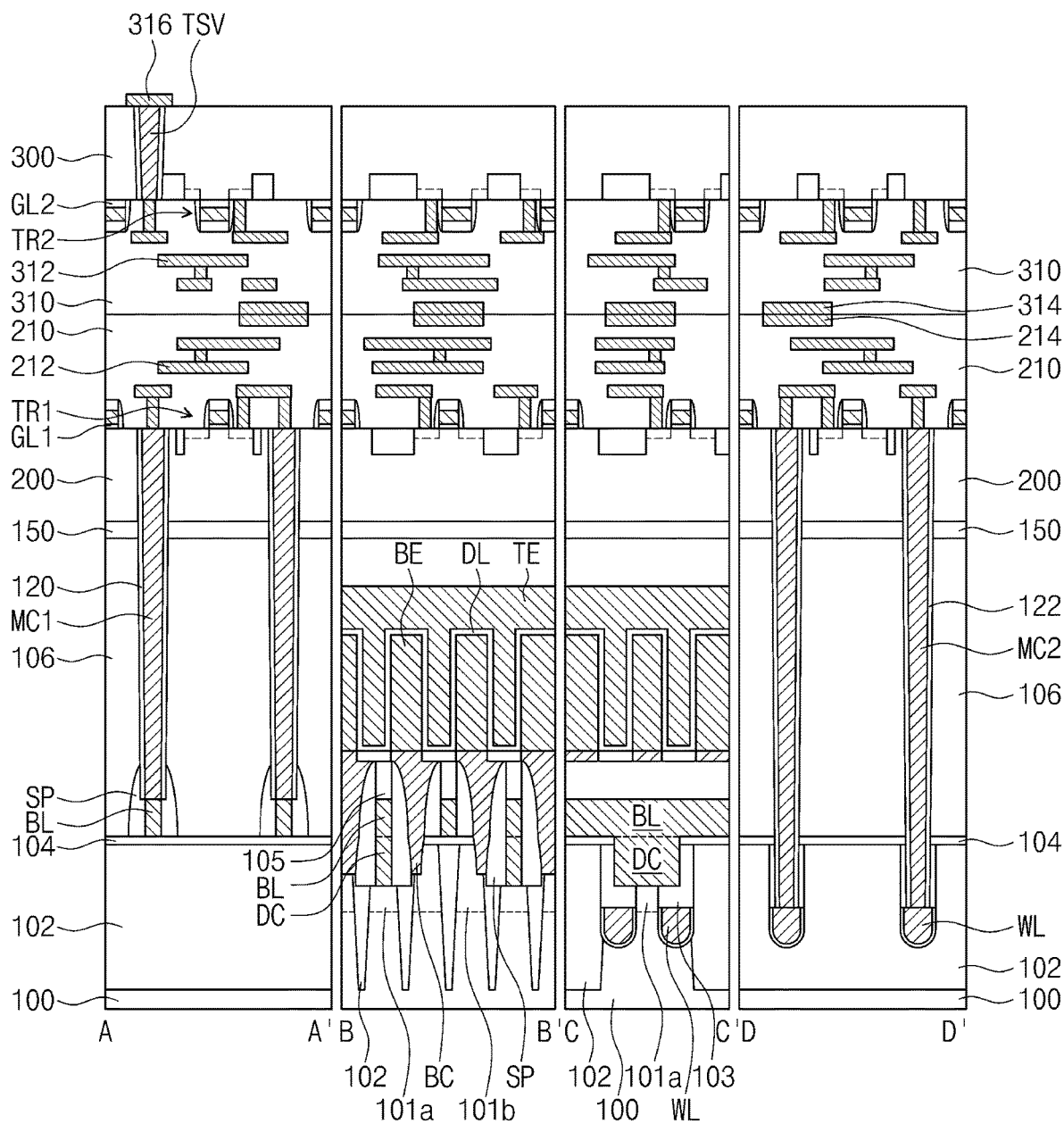
FIG. 4 is a diagram illustrating vertical sections of a semiconductor memory device, according to an example embodiment of the inventive concept, taken along lines A-A', B-B', C-C', and D-D' of FIG. 3.

The semiconductor memory device of FIG. 2 will be described in more detail with reference to FIGS. 3 and 4. FIG. 3 is a plan view of a semiconductor memory device, according to an example embodiment of the inventive concept. FIG. 4 is a diagram illustrating vertical sections of a semiconductor memory device according to an example embodiment of the inventive concept, taken along lines A-A', B-B', C-C', and D-D' of FIG. 3.

Referring to FIGS. 2 to 4, a semiconductor memory device 1000 according to the present embodiment may include the first substrate 100. The semiconductor memory device 1000 may be a semiconductor package. The first substrate 100 may include a single-crystalline semiconductor substrate or a semiconductor epitaxial layer. A plurality of the cell array regions 10 may be placed on the first substrate 100, as shown in FIG. 2. However, for convenience in illustration, a layout of memory cells disposed on one cell array region is illustrated in FIG. 3.

As shown in FIGS. 3 and 4, a device isolation layer 102 may be disposed in the first substrate 100 to define active regions AR. Each of the active regions AR may be a bar-shaped structure elongated in a first direction D1. The first direction D1 may be a direction that is on the same plane as the second direction D2 and the third direction D3, but is at an angle to the second direction D2 and the third direction D3. The word lines WL may be disposed in the first substrate 100. Each of the word lines WL may be a line-shaped pattern extending in a second direction D2 crossing the first direction D1. The word lines WL may be buried in the first substrate 100. For example, top surfaces of the word lines WL may be lower than a top surface of the first substrate 100. The word lines WL may be covered with word line capping patterns 103.

First and second source/drain regions 101a and 101b, which are spaced apart from each other, may be provided in the first substrate 100. The first source/drain region 101a may be provided at a side of each of the word lines WL, and the second source/drain region 101b may be provided at an opposite side of each of the word lines WL. The first substrate 100 may be covered with a pad insulating layer 104. The bit lines BL may be provided on the pad insulating layer 104. Each of the bit lines BL may be a line-shaped pattern extending in a third direction D3 crossing both of the first and second directions D1 and D2. The bit lines BL may be covered with a bit line capping pattern 105. Side surfaces of the bit lines BL may be covered with insulating spacers SP, and side surfaces of the bit line capping pattern 105 may be covered with insulating spacers SP. The insulating spacers SP may contact side surfaces of the bit lines BL and the bit line capping pattern 105.

Each of the bit lines BL may be electrically connected to the first source/drain region 101a through a bit line contact plug DC. A storage node contact plug BC may be disposed between adjacent ones of the bit lines BL. The storage node contact plug BC may be electrically connected to the second source/drain region 101b. Bottom electrodes BE may be provided on the storage node contact plugs BC, respectively. The bottom electrodes BE may be covered with a dielectric layer DL. A top electrode TE may be placed on the dielectric layer DL. The bottom electrodes BE, the dielectric layer DL, and the top electrode TE may constitute capacitors. The top electrode TE may be covered with a first interlayer insulating layer 106. The first interlayer insulating layer 106 may also be referred to as a first interlayered insulating layer 106. The first interlayered insulating layer 106 may include a silicon oxide layer.

An adhesive insulating layer 150 may be placed on the first interlayered insulating layer 106. The adhesive insulating layer 150 may include a silicon oxide layer. The adhesive insulating layer 150 may further include at least one of nitrogen or carbon. The second substrate 200 may be placed on the adhesive insulating layer 150. The adhesive insulating layer 150 may be used to attach the first interlayered insulating layer 106 to the second substrate 200.

The second substrate 200 may be, for example, a silicon epitaxial layer. First transistors TR1 may be provided on the second substrate 200. Each of the first transistors TR1 may include a first gate insulating layer GL1. The first transistors TR1 may be covered with a second interlayer insulating layer 210. The second interlayer insulating layer 210 may also be referred to as second interlayered insulating layer 210. Although not shown, the second interlayered insulating layer 210 may include at least one of silicon oxide, silicon nitride, silicon oxynitride, silicon carbon nitride, or porous insulating layers and may have a single- or multi-layered structure. First interconnection lines 212, which are electrically connected to the first transistors TR1, may be provided in the second interlayered insulating layer 210. A first conductive pad 214 may be provided in a top portion of the second interlayered insulating layer 210. The first conductive pad 214 may include copper.

Circuits, which correspond to the core regions 20 described with reference to FIG. 2, may be provided on the second substrate 200. For example, the first transistors TR1 and the first interconnection lines 212 may constitute the sub-word line drivers 22a and 22b and the sense amplifiers 24a and 24b, which are included in the core regions 20 described with reference to FIG. 2.

Some of the first interconnection lines 212 may be electrically connected to the bit lines BL and the word lines WL through the first and second contact plugs MC1 and MC2. In detail, the first contact plug MC1 may be provided to penetrate the second substrate 200, the adhesive insulating layer 150, the first interlayered insulating layer 106, and the bit line capping pattern 105 and to be in contact with an end portion of the bit line BL. The second contact plug MC2 may be provided to penetrate the second substrate 200, the adhesive insulating layer 150, the first interlayered insulating layer 106, the pad insulating layer 104, and the word line capping pattern 103 and to be in contact with an end portion of the word line WL. A first contact insulating layer 120 may be interposed between the first contact plug MC1 and the second substrate 200. For example, the first contact insulating layer 120 may surround the first contact plug MC1, contacting a side surface of the first contact plug MC1. In some embodiments, the first contact insulating layer 120 may have the same height as the first contact plug MC1, and may extend for the entire length of the first contact plug MC1. A second contact insulating layer 122 may be interposed between the second contact plug MC2 and the second substrate 200. For example, the second contact insulating layer 122 may surround the second contact plug MC2, contacting a side surface of the second contact plug MC2. In some embodiments, the second contact insulating layer 122 may have the same height as the second contact plug MC2, and may extend for the entire length of the second contact plug MC2.

For example, as shown in FIG. 3, end portions of odd-numbered ones of the bit lines BL may protrude toward a top side of FIG. 3 (e.g., in the third direction D3), and end portions of even-numbered ones of the bit lines BL may protrude toward a bottom side of FIG. 3 (e.g., in the direction opposite to the third direction D3). In addition, end portions of odd-numbered ones of the word lines WL may protrude toward a left side of FIG. 3 (e.g., in the direction opposite to the second direction D2), and end portions of even-numbered ones of the word lines WL may protrude toward a right side of FIG. 3 (e.g., in the second direction D2). Thus, it may be possible to increase a misalignment margin in a process of forming the first and second contact plugs MC1 and MC2. For example, the first contact plugs MC1, which contact the bit lines BL, may be offset from one another in the second direction D2. And the second contact plugs MC2, which contact the word lines WL, may be offset from one another in the third direction D3.

A third interlayer insulating layer 310 may be placed on the second interlayered insulating layer 210. The third interlayer insulating layer 310 may also be referred to as a third interlayered insulating layer 310. The third substrate 300 may be placed on the third interlayered insulating layer 310. The third substrate 300 may be a semiconductor single crystalline wafer or a semiconductor epitaxial layer. Second transistors TR2 may be provided on a surface of the third substrate 300, which faces in the direction toward the second substrate 200 and is covered with the third interlayered insulating layer 310. Each of the second transistors TR2 may include a second gate insulating layer GL2. Second interconnection lines 312, which are electrically connected to the second transistors TR2, may be provided in the third interlayered insulating layer 310. A second conductive pad 314 may be provided in a bottom portion of the third interlayered insulating layer. The second conductive pad 314 may be aligned with the first conductive pad 214. The second conductive pad 314 may include copper. Although not shown, the third interlayered insulating layer 310 may include at least one of silicon oxide, silicon nitride, silicon oxynitride, silicon carbon nitride, or porous insulating layers and may have a single- or multi-layered structure. A through via TSV may be provided to penetrate the third substrate 300. An outer conductive pad 316 may be provided on the through via TSV. The outer conductive pad 316 may be an input/output pad connected to an external device.

The third interlayered insulating layer 310 and the second interlayered insulating layer 210 may be in contact with each other. The second conductive pad 314 and the first conductive pad 214 may be in contact with each other and may be electrically connected to each other. Circuits corresponding to the peripheral circuit region 30 of FIG. 2 may be disposed on the third substrate 300. In detail, the second transistors TR2 and the second interconnection lines 312 may constitute the row decoders 32 and the column decoders 34 described with reference to FIG. 2.

In an example embodiment of the inventive concept, a density of the first transistors TR1 disposed on the second substrate 200 may be greater than a density of the second transistors TR2 disposed on the third substrate 300. For example, the number of the first transistors TR1 disposed on the second substrate 200 may be greater than the number of the second transistors TR2 disposed on the third substrate 300. In an example embodiment, the second gate insulating layer GL2 may be thicker than the first gate insulating layer GL1. The second transistors TR2 may be high-voltage transistors. The first transistors TR1 may be low-voltage transistors.

For the peripheral circuit region 30 provided with the input/output pad, it may be important to increase a data transferring speed in a data input/output operation. In an example embodiment of the inventive concept, since the second transistors TR2 are high-voltage transistors and the second gate insulating layer GL2 has a relatively large thickness, it may be possible to apply a high voltage to the second transistors TR2, and this may make it possible to increase a data transferring speed in a data input/output operation. Thus, it may be possible to increase a data exchange speed or performance of a semiconductor memory device.

In the meantime, because the density or number of the first transistors TR1 on the core region 20 is great, even when an amount of a leakage current produced in each of the first transistors TR1 is small, an operation of the semiconductor memory device may be greatly affected by a total leakage current of the first transistors TR1. Thus, for the core region 20, it may be important to reduce a total amount of the leakage current. In an example embodiment of the inventive concept, since the first transistors TR1 are low-voltage transistors and the first gate insulating layer GL1 has a relatively thin thickness, a low voltage may be applied to the first transistors TR1, and this may make it possible to reduce a leakage current in each of the first transistors TR1.

In a semiconductor memory device according to an example embodiment of the inventive concept, devices of respective circuit regions may be realized on different substrates from each other. Thus, it may be possible to easily realize devices optimized for each circuit region and to realize a semiconductor memory device with improved reliability. Furthermore, the core regions 20, which correspond to the cell array regions 10, respectively, may be vertically connected to the cell array regions 10 through the first and second contact plugs MC1 and MC2, and this may make it possible to reduce a planar size. Thus, it may be possible to reduce a form factor of the semiconductor memory device. In addition, it may be possible to increase a degree of freedom in designing the semiconductor memory device.

Figure 5:
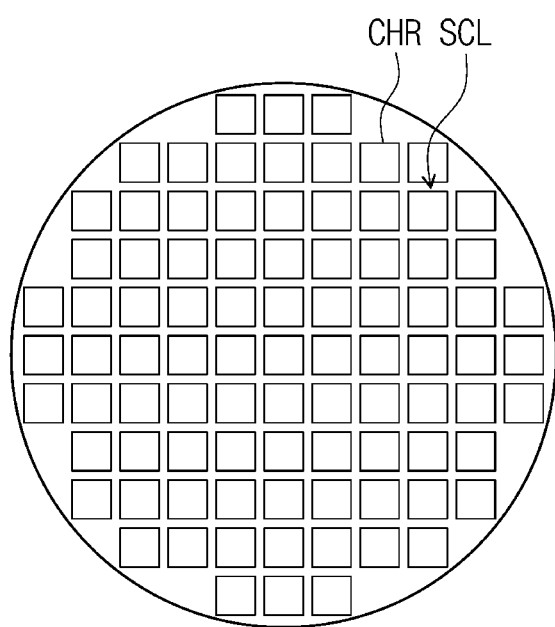
FIG. 5 is a plan view illustrating a first wafer, according to an example embodiment of the inventive concept.

FIG. 5 is a plan view illustrating a first wafer according to an example embodiment of the inventive concept. FIGS. 6A to 6M are sectional views illustrating a process of fabricating a semiconductor memory device (e.g., having the vertical sections of FIG. 4) according to an example embodiment of the inventive concept.

Referring to FIGS. 5 and 6A, a first wafer 100w may be fabricated. The first wafer 100w may include a plurality of chip regions CHR, which are spaced apart from each other, as shown in FIG. 5. The chip regions CHR may be separated from each other by a scribe lane region SCL. In some embodiments, the scribe lane region SCL may comprise areas of the first wafer 100w in which no circuits (e.g., no transistors) are formed and/or test patterns are disposed. Each of the chip regions CHR may include the cell array regions 10 described with reference to FIGS. 2 to 4. In detail, the first wafer 100w may include the first substrate 100 and the first interlayered insulating layer 106. In the first wafer 100w, the word lines WL, the bit lines BL, and the capacitors, which were described with reference to FIGS. 3 and 4, may be provided on the chip regions CHR. A first alignment key AK1 may be provided on the scribe lane region SCL of the first wafer 100w. The first alignment key AK1 may be covered with the first interlayered insulating layer 106. A process of fabricating the first wafer 100w may include processes of fabricating memory cells in a cell array region of a DRAM device.

Figure 6B:
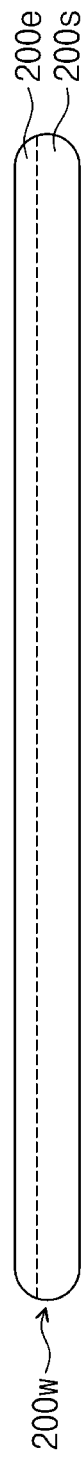

As shown in FIG. 6B, a second wafer 200w may be fabricated. The fabrication of the second wafer 200w may include forming a semiconductor epitaxial layer 200e on a single-crystalline semiconductor substrate 200s. The single-crystalline semiconductor substrate 200s and the semiconductor epitaxial layer 200e may be doped with, for example, a first impurity of a first conductivity type. The first impurity of the first conductivity type may be P-type dopants (e.g., boron). A concentration of the first impurity doped in the single-crystalline semiconductor substrate 200s may be different from that in the semiconductor epitaxial layer 200e. For example, the concentration of the first impurity doped in the single-crystalline semiconductor substrate 200s may be greater than that in the semiconductor epitaxial layer 200e. The difference in the concentration of the first impurity between the single-crystalline semiconductor substrate 200s and the semiconductor epitaxial layer 200e may lead to a difference in etch/polishing rate in a subsequent polishing/etching process.

Figure 6C:
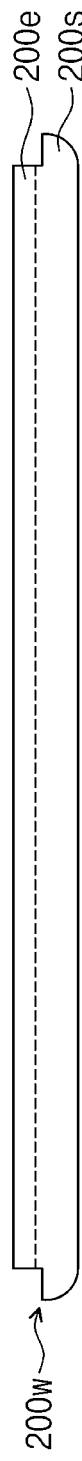

Referring to FIG. 6C, an edge portion of the second wafer 200w may be partially removed. In detail, an edge portion of the semiconductor epitaxial layer 200e may be removed to expose a top surface of the single-crystalline semiconductor substrate 200s. This process may be performed to prevent a process failure from occurring in a subsequent polishing/grinding process.

Figure 6D:
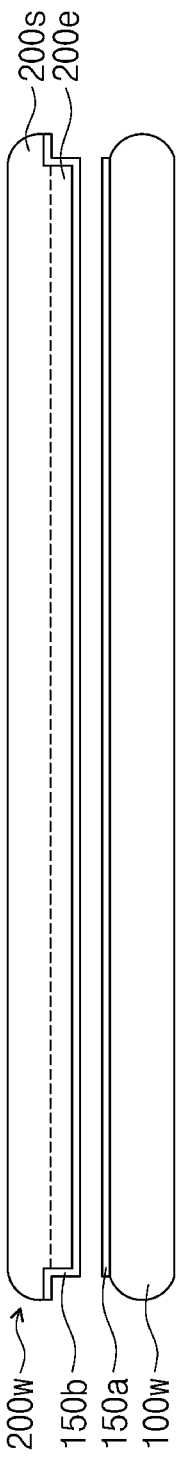

Referring to FIG. 6D, a first preliminary adhesive insulating layer 150a may be deposited to cover the entire top surface of the first wafer 100w. The first preliminary adhesive insulating layer 150a may be deposited on the first interlayered insulating layer 106. A second preliminary adhesive insulating layer 150b may be deposited to cover the entire top surface of the second wafer 200w. For example, the second preliminary adhesive insulating layer 150b may be formed on the semiconductor epitaxial layer 200e. In addition, the second preliminary adhesive insulating layer 150b may be formed on side surfaces of the semiconductor epitaxial layer 200e and on the top surface of the single-crystalline semiconductor substrate 200s exposed by removal of the edge portion of the semiconductor epitaxial layer 200e. The first and second preliminary adhesive insulating layers 150a and 150b may be formed of or may include at least one of silicon oxide, silicon nitride, silicon oxynitride, silicon carbide, silicon carbon nitride, metal oxide, or metal nitride.

Figure 6E:
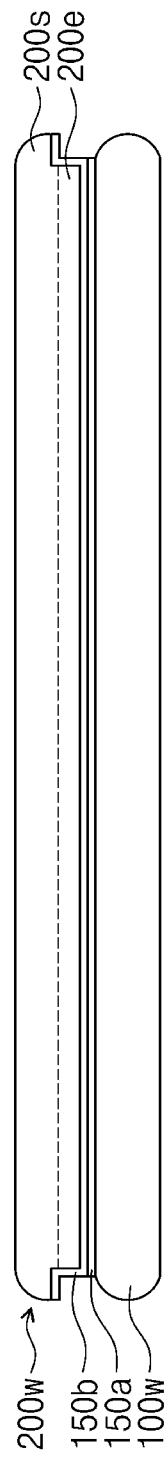
Figure 6F:
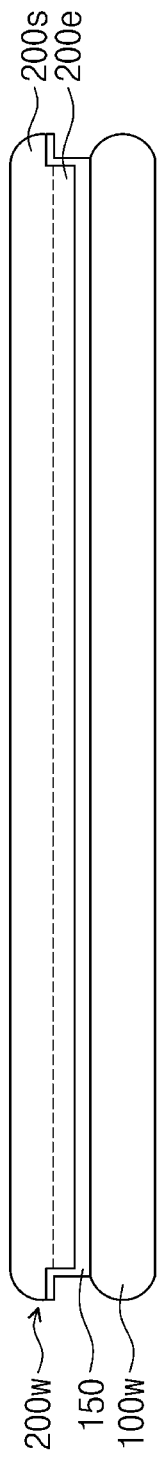

Referring to FIGS. 6E and 6F, the second wafer 200w may be disposed on the first wafer 100w such that the first and second preliminary adhesive insulating layers 150a and 150b contact each other. Thereafter, an annealing process may be performed. As a result of the annealing process, the first and second preliminary adhesive insulating layers 150a and 150b may be bonded to each other to form the adhesive insulating layer 150.

Figure 6G:
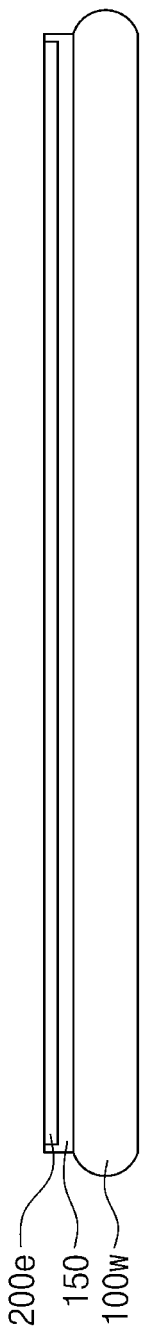

Referring to FIG. 6G, the single-crystalline semiconductor substrate 200s may be removed from the second wafer 200w. This removal process may be performed using at least one of a back-grinding process, a chemical mechanical polishing (CMP) process, or a wet etching process. This removal process may be performed using an etchant containing at least one of fluoric acid, nitric acid, phosphoric acid, or acetic acid. Owing to the previously-described difference in concentration of the first impurity, there may be a difference in polishing/etch rate between the single-crystalline semiconductor substrate 200s and the semiconductor epitaxial layer 200e. Thus, it may be possible to selectively remove the single-crystalline semiconductor substrate 200s.

If the edge portion of the semiconductor epitaxial layer 200e is not removed in the step of FIG. 6C, a remaining edge portion of the semiconductor epitaxial layer 200e after the removal of the single-crystalline semiconductor substrate 200s may be relatively thin, compared with its main portion, and may be mechanically weak. In this case, during the grinding/polishing process, the edge portion of the semiconductor epitaxial layer 200e may be broken, thereby causing a process failure. By contrast, according to an example embodiment of the inventive concept, since the edge portion of the semiconductor epitaxial layer 200e is removed in advance in the step of FIG. 6C, it may be possible to prevent the edge portion of the semiconductor epitaxial layer 200e from being broken. For example, it may be possible to prevent the process failure from occurring.

Figure 6H:
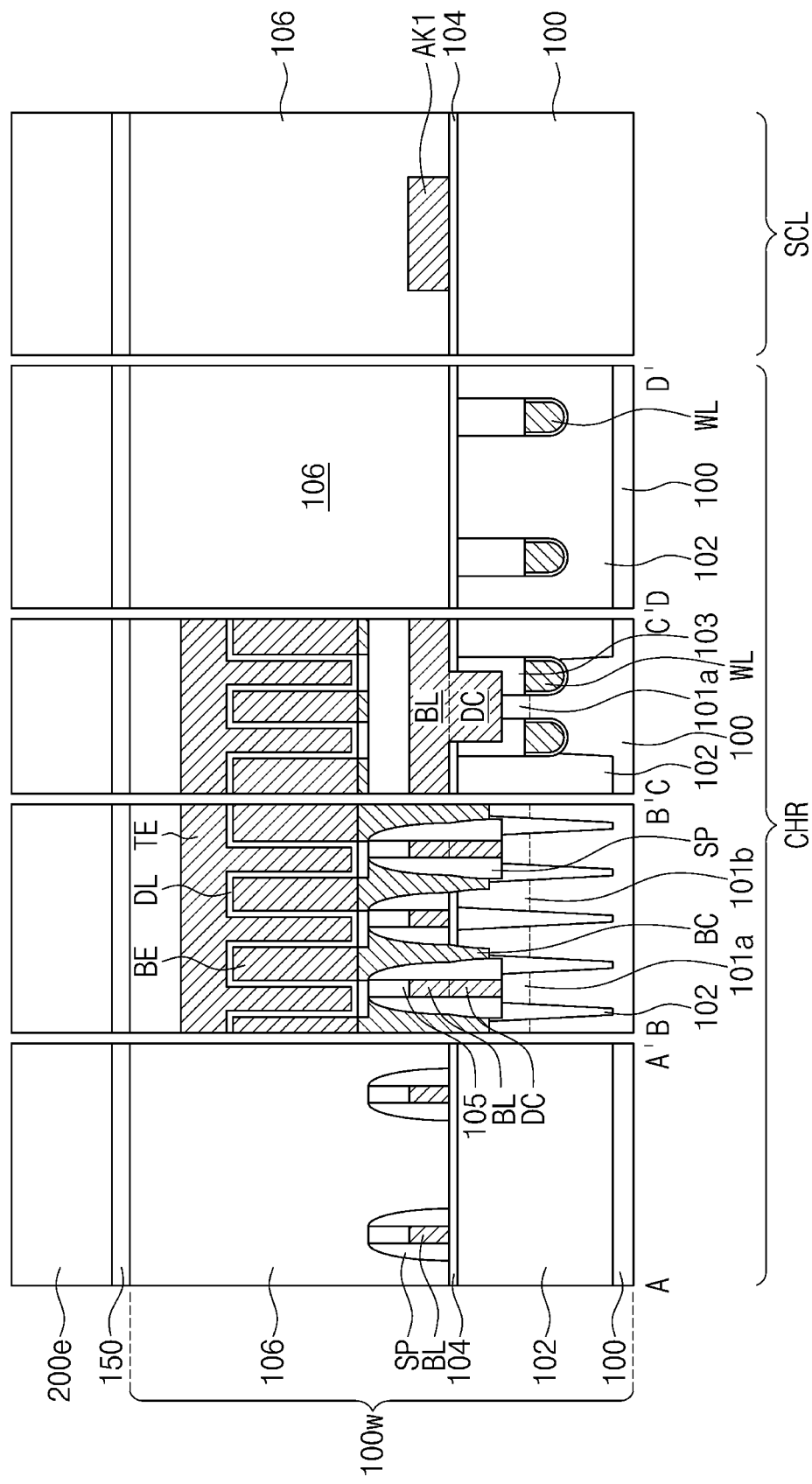

Referring to FIGS. 6G and 6H, after the removal of the single-crystalline semiconductor substrate 200s, the semiconductor epitaxial layer 200e may remain on the adhesive insulating layer 150. FIG. 6H illustrates an enlarged section structure of a portion of FIG. 6G. The semiconductor epitaxial layer 200e may correspond to the second substrate 200 of FIG. 4, in the final structure. In some embodiments, at the time the second wafer 200w is disposed on the first wafer 100w, the semiconductor epitaxial layer 200e may not include any circuits.

Figure 6I:
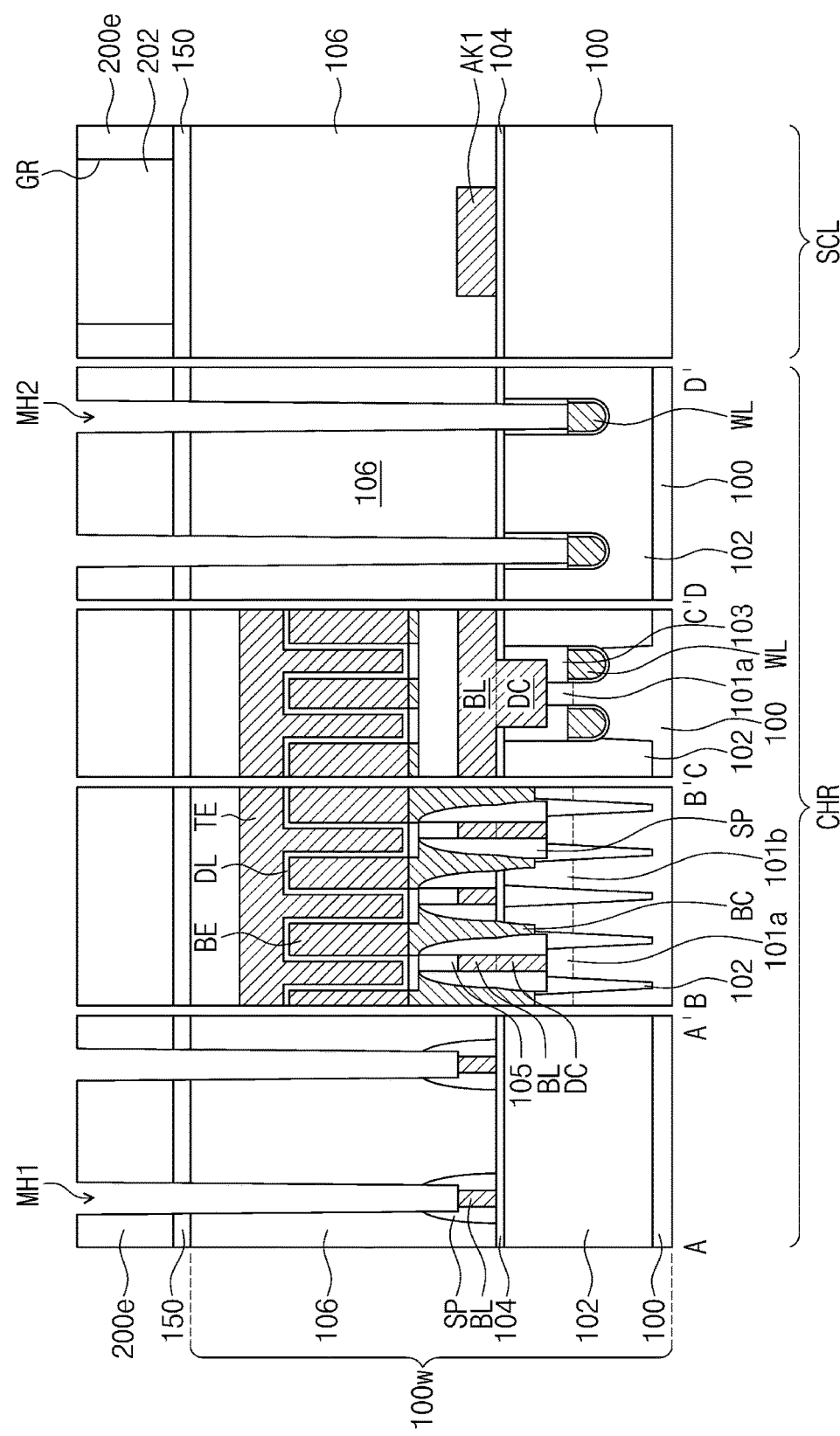

Referring to FIG. 6I, the semiconductor epitaxial layer 200e, which is overlapped with the scribe lane region SCL of the first wafer 100w, may be removed to form a groove GR exposing the adhesive insulating layer 150. The groove GR may be overlapped with the scribe lane region SCL of the first wafer 100w. An insulating gapfill layer 202 may be formed to fill the groove GR. The insulating gapfill layer 202 may include a silicon oxide layer. Since the insulating gapfill layer 202, the adhesive insulating layer 150, and the first interlayered insulating layer 106 includes silicon oxide layers, they may be transparent. Thus, the first alignment key AK1 may be recognized through the groove GR or the insulating gapfill layer 202.

Positions of the end portions of the bit lines BL and the word lines WL in the first wafer 100w may be precisely recognized using the first alignment key AK1. Thus, first contact holes MH1 and second contact holes MH2 may be precisely formed without a misalignment issue. In detail, the semiconductor epitaxial layer 200e, the adhesive insulating layer 150, the first interlayered insulating layer 106, and the bit line capping pattern 105 may be sequentially etched to form the first contact holes MH1 exposing the end portions of the bit lines BL. Similarly, the semiconductor epitaxial layer 200e, the adhesive insulating layer 150, the first interlayered insulating layer 106, the pad insulating layer 104, and the word line capping pattern 103 may be sequentially etched to form the second contact holes MH2 exposing the end portions of the word lines WL. In an example embodiment, the first and second contact holes MH1 and MH2 may be formed at the same time.

Figure 6J:
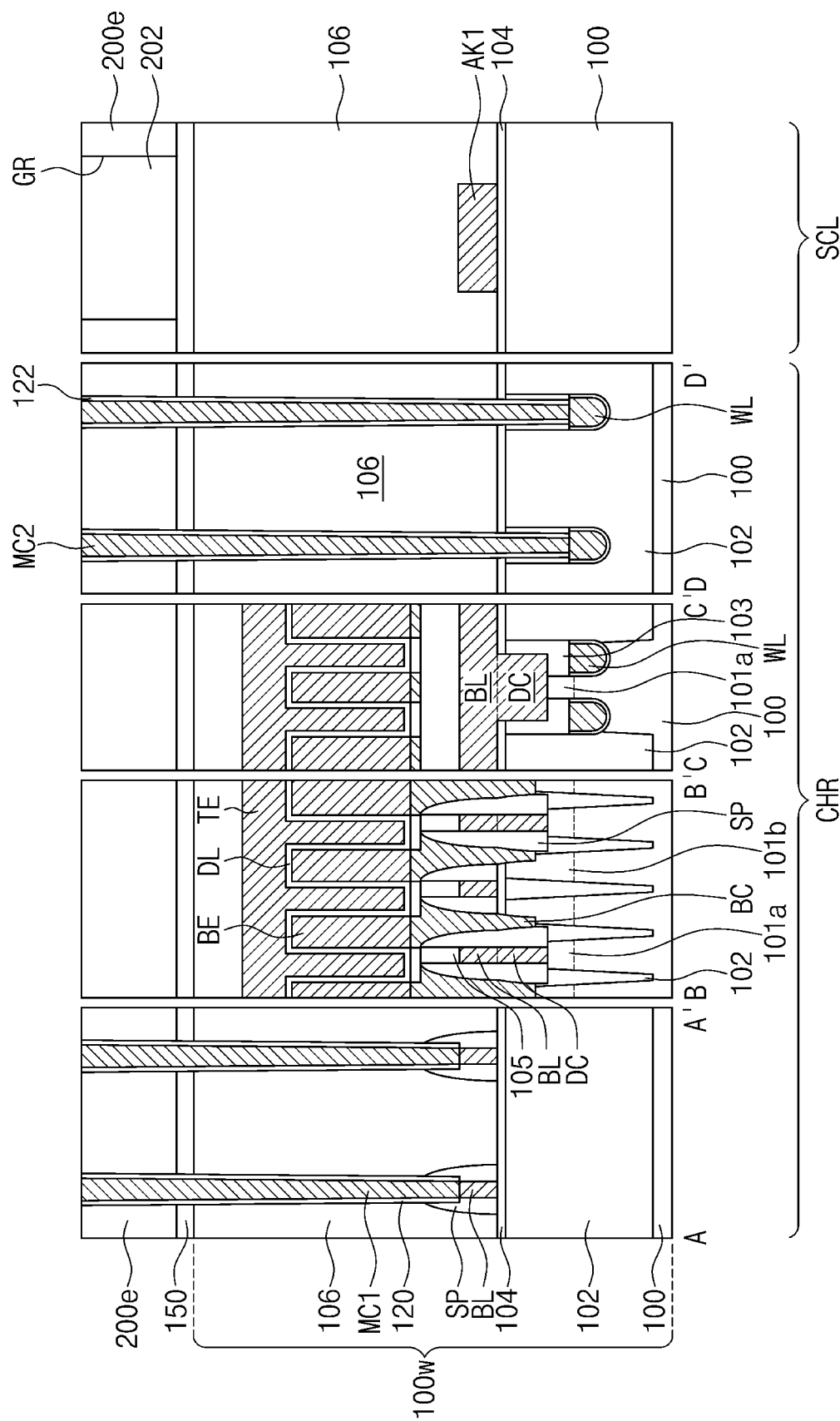

Referring to FIG. 6J, an insulating layer may be conformally deposited and anisotropically etched to form the first contact insulating layer 120 and the second contact insulating layer 122, which cover side surfaces of the first and second contact holes MH1 and MH2, respectively. Thereafter, a conductive layer may be deposited to fill the first and second contact holes MH1 and MH2, and a polishing process and/or an etching process may be performed on the conductive layer to form the first and second contact plugs MC1 and MC2 in the first and second contact holes MH1 and MH2, respectively.

Figure 6K:
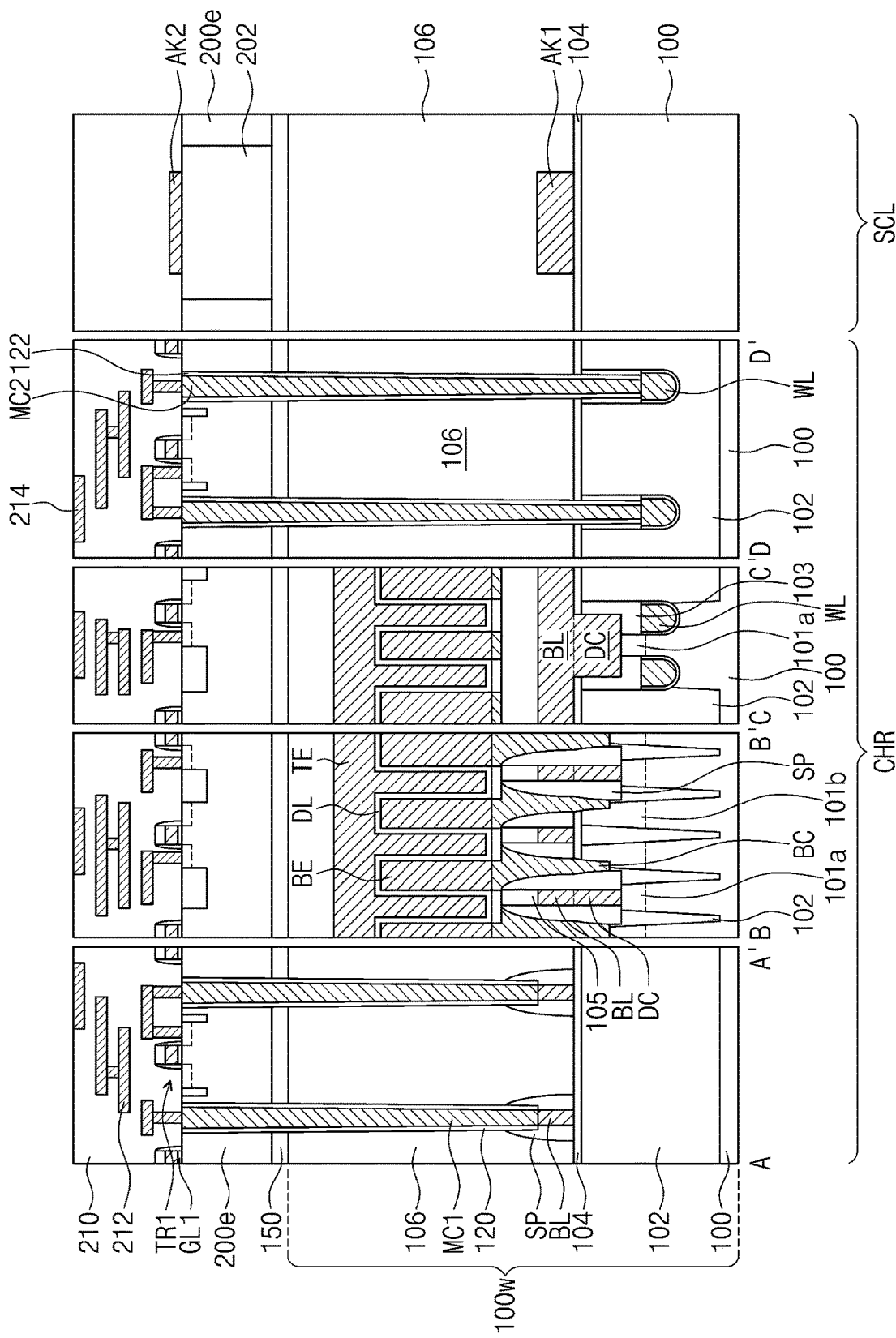

Referring to FIG. 6K, the first transistors TR1, the first interconnection lines 212, the first conductive pad 214, and the second interlayered insulating layer 210 may be formed on the semiconductor epitaxial layer 200e. The first transistors TR1, the first interconnection lines 212, and the first conductive pad 214 may not be formed on the scribe lane region SCL. A second alignment key AK2 may be formed on the scribe lane region SCL of the semiconductor epitaxial layer 200e. The first transistors TR1 may be formed to have the structure of the low-voltage transistor.

Referring to FIGS. 6L and 4, a third wafer 300w may be prepared. The third wafer 300w may correspond to the third substrate 300 of FIG. 4, in the final structure. The third interlayered insulating layer 310 may be formed on the third wafer 300w. The second transistors TR2, the second interconnection lines 312, and the second conductive pad 314, described with reference to FIG. 4, may be formed on the third wafer 300w. The second transistors TR2 may be formed to have the structure of the high-voltage transistor. The third wafer 300w may be placed on the semiconductor epitaxial layer 200e such that the third interlayered insulating layer 310 and the second conductive pad 314 are in contact with the second interlayered insulating layer 210 and the first conductive pad 214, respectively, and then, a thermos-compression process may be performed to bond the third interlayered insulating layer 310 to the second interlayered insulating layer 210. In an example embodiment, the second conductive pad 314 may be bonded to the first conductive pad 214.

Referring to FIG. 6M, a singulation process of removing the scribe lane regions SCL may be performed to form a plurality of the semiconductor memory devices 1000. In FIG. 6M, the scribe lane regions SCL are shown by the dotted line boxes.

A method of fabricating a semiconductor memory device, according to an example embodiment of the inventive concept, may include forming devices, whose required characteristics are different from each other, on different substrates, stacking the substrates, and connecting the substrates to each other. If all of cell array regions, core regions, and peripheral circuit regions are provided in a single substrate, devices on each region may be affected by a process of forming the devices on other regions. This may lead to an increase in process complexity or a process failure. For example, when memory cells are fabricated on the cell array region, it may be necessary to form or remove a mask layer covering the core regions and the peripheral circuit regions. By contrast, the fabricating method according to the present embodiment may include forming devices, whose required characteristics are different from each other, on different substrates, stacking the substrates, and connecting the substrates to each other, and this may make it possible to prevent each region from being interfered by other regions. Accordingly, it may be possible to simplify an overall process of fabricating the semiconductor memory device and to reduce a process failure. In addition, devices can be easily optimized to have electric characteristics required for respective circuit regions.

Figure 7:
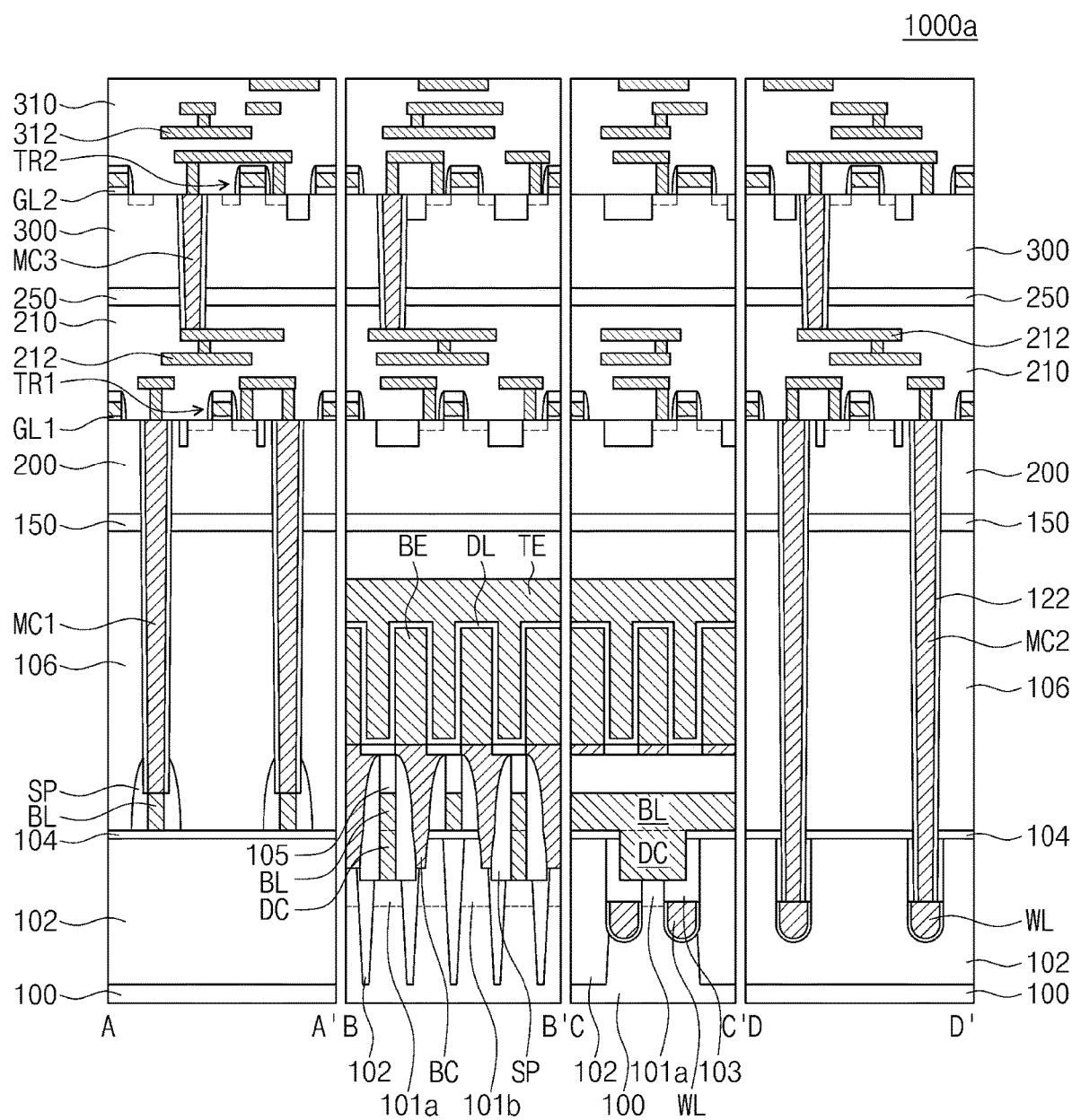
FIG. 7 is a diagram illustrating vertical sections of a semiconductor memory device, according to an example embodiment of the inventive concept, taken along lines A-A', B-B', C-C', and D-D' of FIG. 3.

FIG. 7 is a diagram illustrating vertical sections of a semiconductor memory device, according to an example embodiment of the inventive concept, taken along lines A-A', B-B', C-C', and D-D' of FIG. 3.

Referring to FIG. 7, in a semiconductor memory device 1000a according to the present embodiment, the first adhesive insulating layer 150 may be disposed on the first interlayered insulating layer 106. The second substrate 200 and the second interlayered insulating layer 210 may be sequentially stacked on the first adhesive insulating layer 150. A second adhesive insulating layer 250 may be disposed on the second interlayered insulating layer 210. The third substrate 300 and the third interlayered insulating layer 310 may be sequentially stacked on the second adhesive insulating layer 250. The first adhesive insulating layer 150 may be used to bond the first interlayered insulating layer 106 to the second substrate 200. The second adhesive insulating layer 250 may be used to attach the second interlayered insulating layer 210 to the third substrate 300. The second transistors TR2 and the second interconnection lines 312 may be disposed on the third substrate 300. Third contact plugs MC3 may be provided to penetrate the third substrate 300, the second adhesive insulating layer 250, and a portion of the second interlayered insulating layer 210 and to electrically connect some of the second interconnection lines 312 to some of the first interconnection lines 212. Except for the afore-described structural features, the semiconductor memory device 1000a of FIG. 7 may have substantially the same features as that of semiconductor memory device 1000 described with reference to FIGS. 2 to 4.

The second adhesive insulating layer 250 of the semiconductor memory device 1000a of FIG. 7 may be formed using the same or similar method as that of the first adhesive insulating layer 150 described with reference to FIGS. 6B to 6F. The third contact plug MC3 may be formed using the same or similar method as that of the first and second contact plugs MC1 and MC2 described with reference to FIGS. 6I and 6J.

Figure 8:
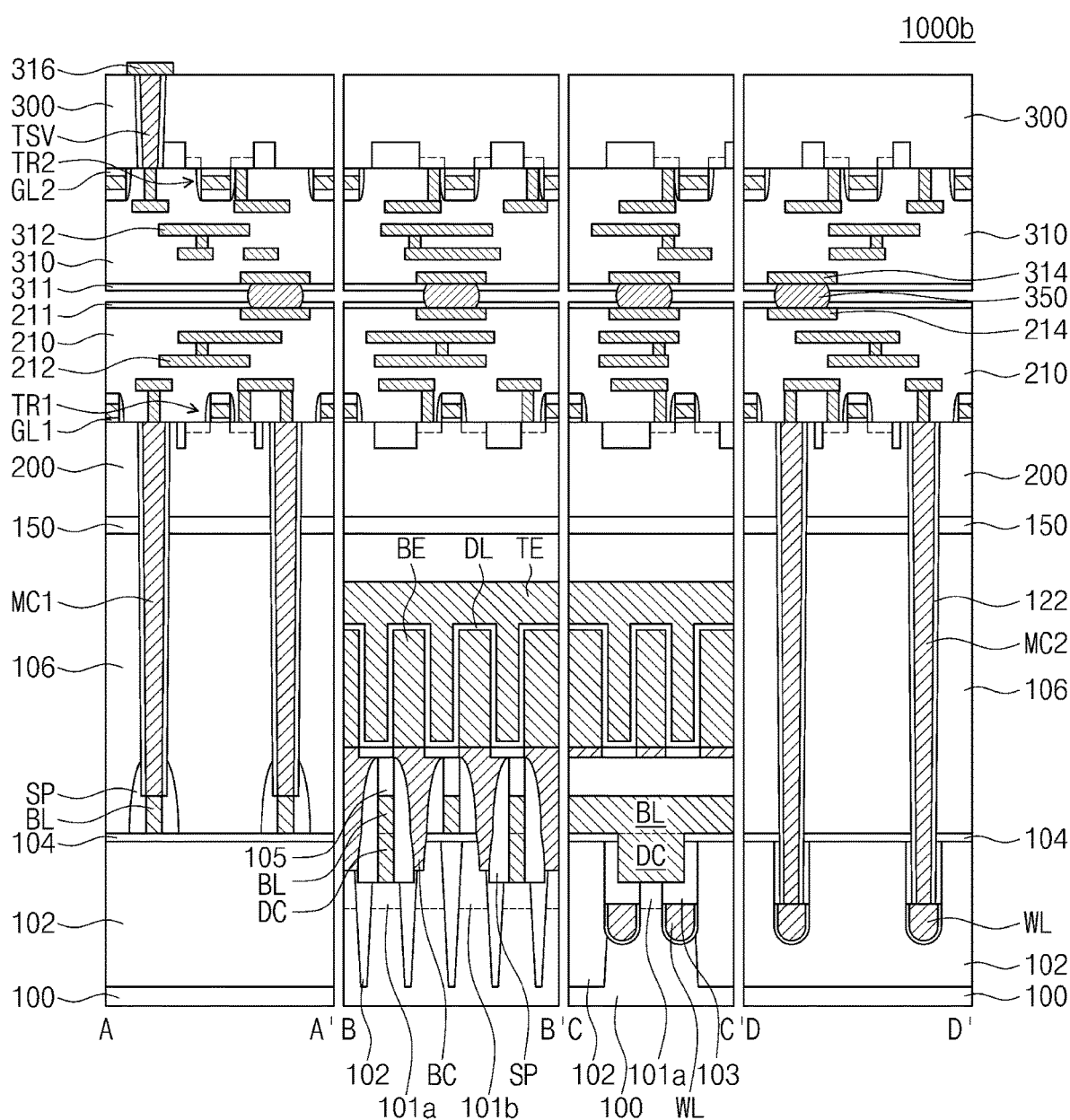
FIG. 8 is a diagram illustrating vertical sections of a semiconductor memory device, according to an example embodiment of the inventive concept, taken along lines A-A', B-B', C-C', and D-D' of FIG. 3.

FIG. 8 is a diagram illustrating vertical sections of a semiconductor memory device according to an example embodiment of the inventive concept, taken along lines A-A', B-B', C-C', and D-D' of FIG. 3.

Referring to FIG. 8, in a semiconductor memory device 1000b according to an example embodiment, a connection member 350 may be interposed between the first conductive pad 214 and the second conductive pad 314. The connection member 350 may include at least one of, for example, a copper bump, a solder ball, or a solder layer. A top surface of the second interlayered insulating layer 210 may be covered by a first protective layer 211, and a top surface of the third interlayered insulating layer 310 may be covered by a second protective layer 311. The first and second protective layers 211 and 311 may surround respective lower and upper portions of the connection member 250. Each of the first and second protective layers 211 and 311 may be insulating layers. Except for the afore-described features, the semiconductor memory device 1000b of FIG. 8 may have substantially the same features as that described with reference to FIGS. 2 to 4.

The semiconductor memory device 1000b of FIG. 8 may be fabricated by connecting the third substrate 300 to the second substrate 200 in a flip-chip bonding manner.

Figure 9:
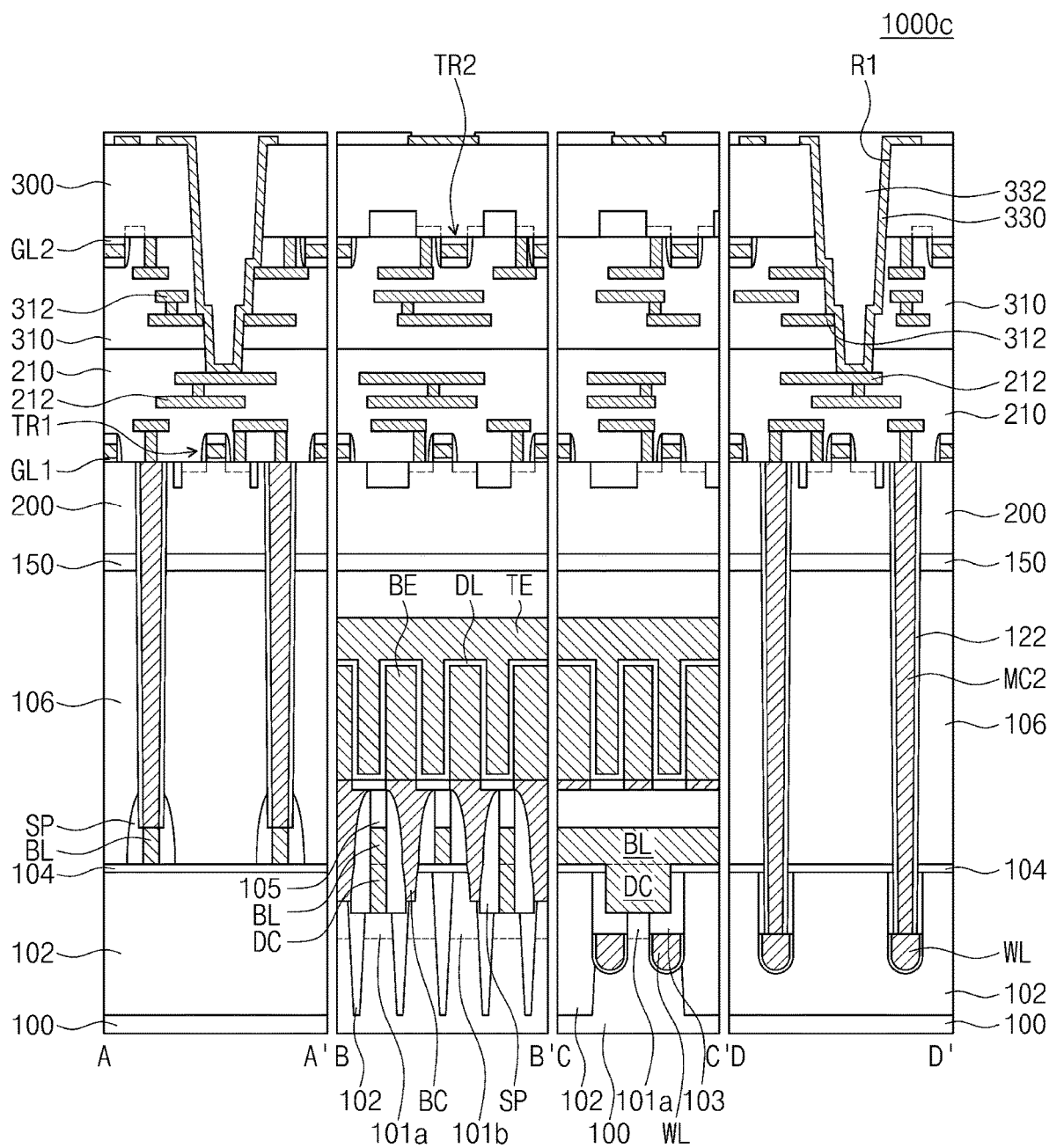
FIG. 9 is a diagram illustrating vertical sections of a semiconductor memory device, according to an example embodiment of the inventive concept, taken along lines A-A', B-B', C-C', and D-D' of FIG. 3.

FIG. 9 is a diagram illustrating vertical sections of a semiconductor memory device according to an example embodiment of the inventive concept, taken along lines A-A', B-B', C-C', and D-D' of FIG. 3.

Referring to FIG. 9, in a semiconductor memory device 1000c according to the present embodiment, a conductive structure 330 may be provided, instead of the through via TSV and the first and second conductive pads 214 and 314 of FIG. 4. The conductive structure 330 may be called a back via stack (BVS). The conductive structure 330 may be provided to penetrate the third substrate 300, the third interlayered insulating layer 310, and a portion of the second interlayered insulating layer 210, and may be used to connect some of the first interconnection lines 212 electrically to some of the second interconnection lines 312. Although not shown, an insulating layer may be interposed between the conductive structure 330 and the third substrate 300. A passivation layer 332 may be disposed on the third substrate 300. The passivation layer 332 may cover an inner surface of the conductive structure 330. The conductive structure 330 may be placed in a recess region R1. The passivation layer 332 may fill the recess region R1 provided with the conductive structure 330. Except for the afore-described features, the semiconductor memory device 1000c of FIG. 9 may have substantially the same features as that described with reference to FIGS. 2 to 4.

The semiconductor memory device of FIG. 9 may be fabricated through the following process. The third wafer 300w may be placed on the semiconductor epitaxial layer 200e, as shown in FIG. 6L, and then, the recess region R1 may be formed by removing the third wafer 300w, the third interlayered insulating layer 310, and a portion of the second interlayered insulating layer 210 in the regions where the conductive structure 330 is to be formed. Thereafter, a conductive layer may be conformally deposited and may be patterned to form the conductive structure 330. Next, the passivation layer 332 may be formed. A subsequent process may be performed by the same or similar method described above.

Figure 10:
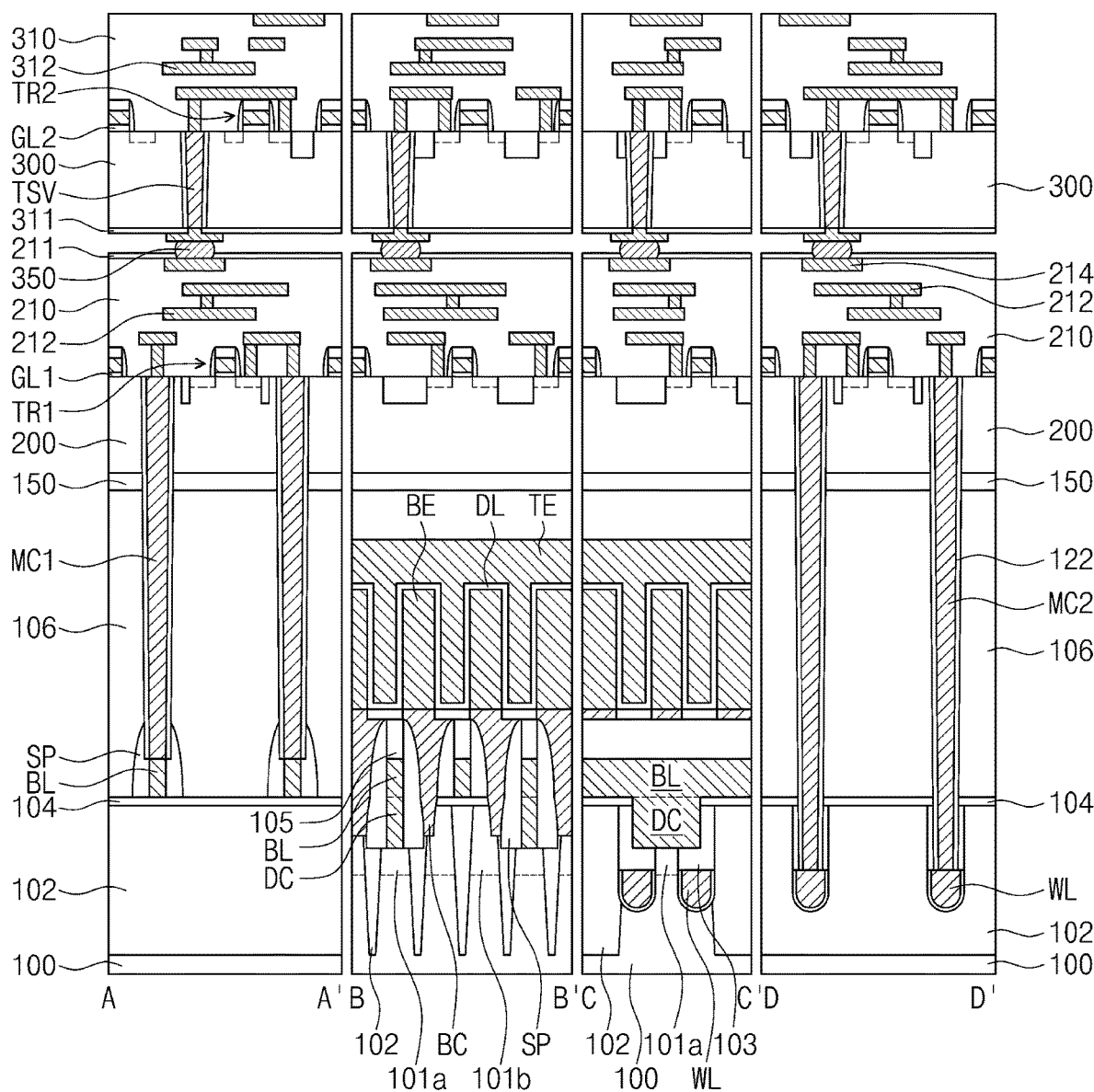
FIG. 10 is a diagram illustrating vertical sections of a semiconductor memory device, according to an example embodiment of the inventive concept, taken along lines A-A', B-B', C-C', and D-D' of FIG. 3.

FIG. 10 is a diagram illustrating vertical sections of a semiconductor memory device according to an example embodiment of the inventive concept, taken along lines A-A', B-B', C-C', and D-D' of FIG. 3.

Referring to FIG. 10, a semiconductor memory device 1000d according to the present embodiment may have a structure similar to that obtained by vertically inverting the third substrate 300 and the third interlayered insulating layer 310 of FIG. 8. The third substrate 300 may be disposed adjacent to the second interlayered insulating layer 210. The through via TSV may be provided in the third substrate 300. The through via TSV may be electrically connected to the first conductive pad 214 through the connection member 350. Except for the afore-described features, the semiconductor memory device 1000d of FIG. 10 may have substantially the same features as that described with reference to FIG. 8.

Figure 11:
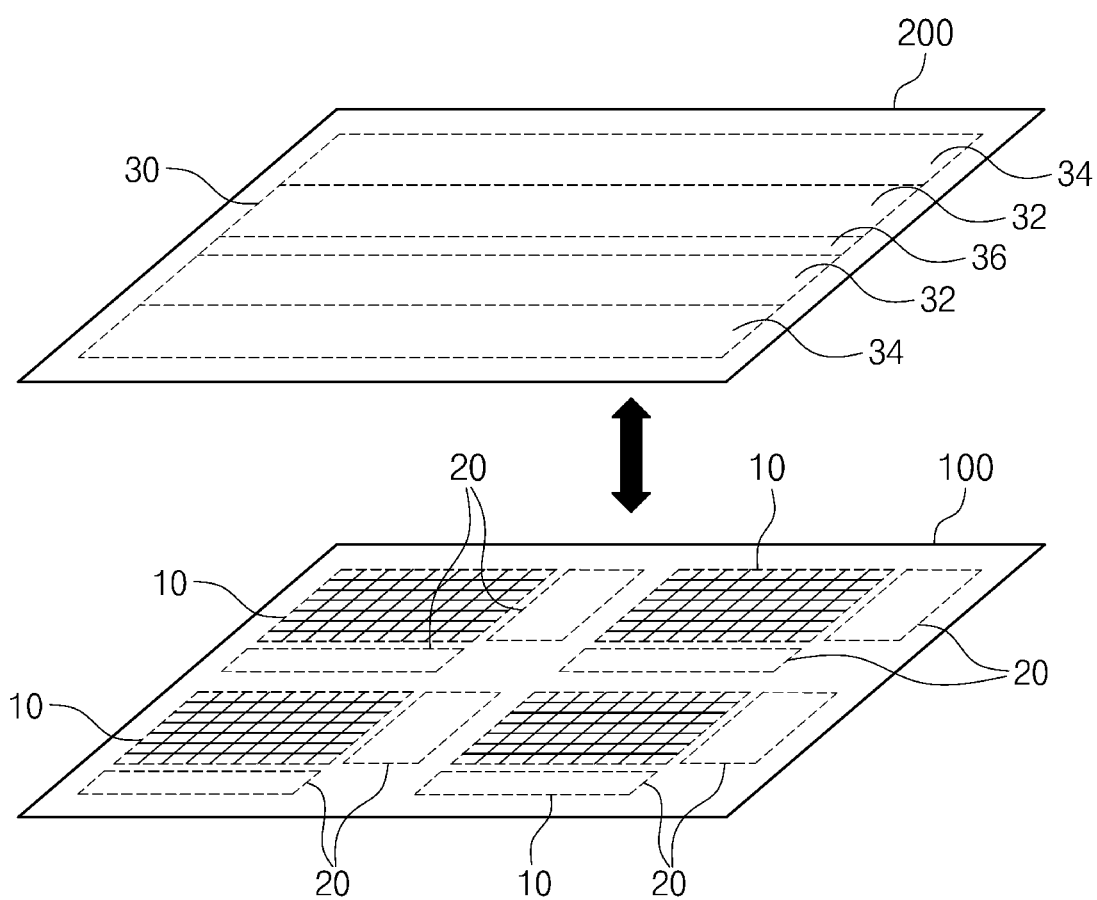
FIG. 11 is a conceptual diagram illustrating a semiconductor memory device, according to an example embodiment of the inventive concept.
Figure 12:
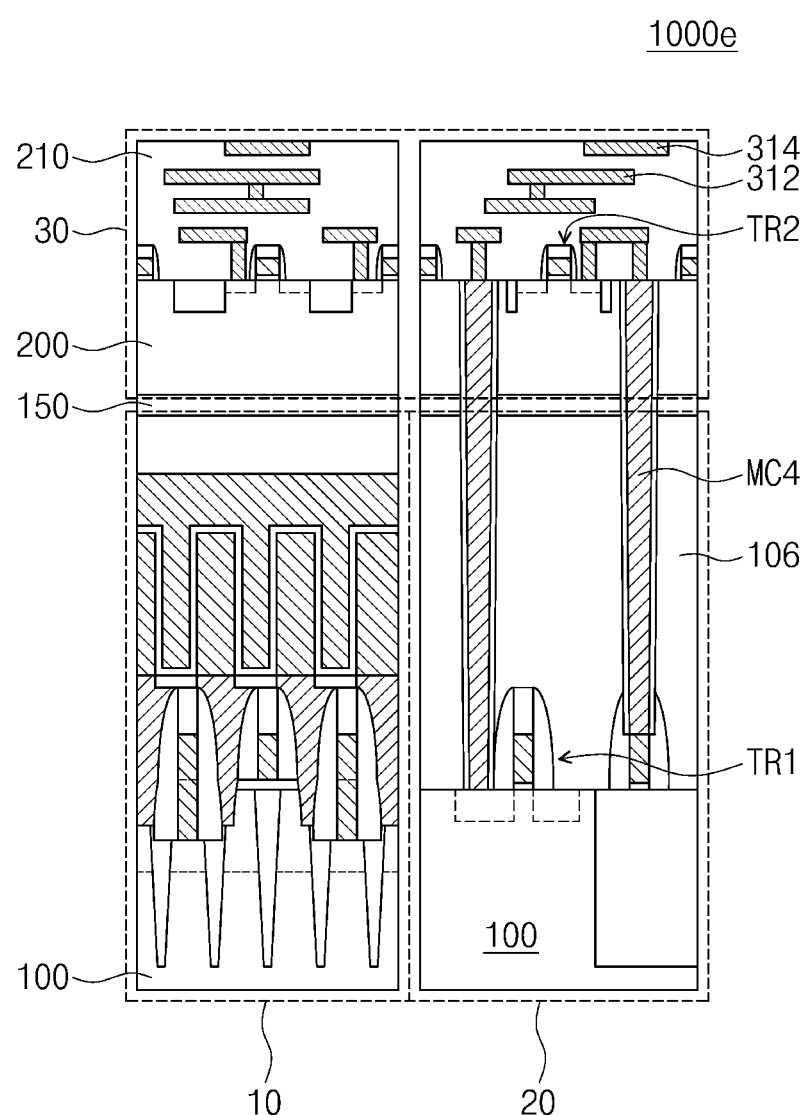
FIG. 12 is a sectional view illustrating a semiconductor memory device, according to an example embodiment of the inventive concept.

FIG. 11 is a conceptual diagram illustrating a semiconductor memory device according to an example embodiment of the inventive concept. FIG. 12 is a sectional view illustrating a semiconductor memory device according to an example embodiment of the inventive concept.

Referring to FIGS. 11 and 12, in a semiconductor memory device 1000e according to the present embodiment, the first substrate 100 may include the cell array regions 10 and the core regions 20. The core regions 20 may be placed adjacent to respective ones of the cell array regions 10. The first transistors TR1 may be disposed on the core regions 20. Although not shown, first interconnection lines may be disposed on the core regions 20. On the core regions 20, the first transistors TR1 and the first interconnection lines may constitute the sub-word line drivers and the sense amplifiers.

The second substrate 200 may be disposed on the first substrate 100. The adhesive insulating layer 150 may be interposed between the first interlayered insulating layer 106 and the second substrate 200. The adhesive insulating layer 150 may contact a top surface of the first interlayered insulating layer 106 and contact a surface of the second substrate 200. The second substrate 200 may include the peripheral circuit region 30. The second transistors TR2, the second interconnection lines 312, the second conductive pad 314, and the second interlayered insulating layer 210 may be disposed on the second substrate 200. On the peripheral circuit region 30, the second transistors TR2 and the second interconnection lines 312 may constitute the row decoders 32 and the column decoders 34. The second conductive pad 314 may correspond to the input/output pad.

Fourth contact plugs MC4 may be disposed on the core regions 20 of the first substrate 100. The fourth contact plugs MC4 may be used to electrically connect the first transistors TR1 on the core regions 20 with the second interconnection lines 312 on the peripheral circuit region 30. Except for the afore-described features, the semiconductor memory device 1000e of FIG. 12 may have substantially the same features as that described with reference to FIGS. 2 to 4.

Figure 13:
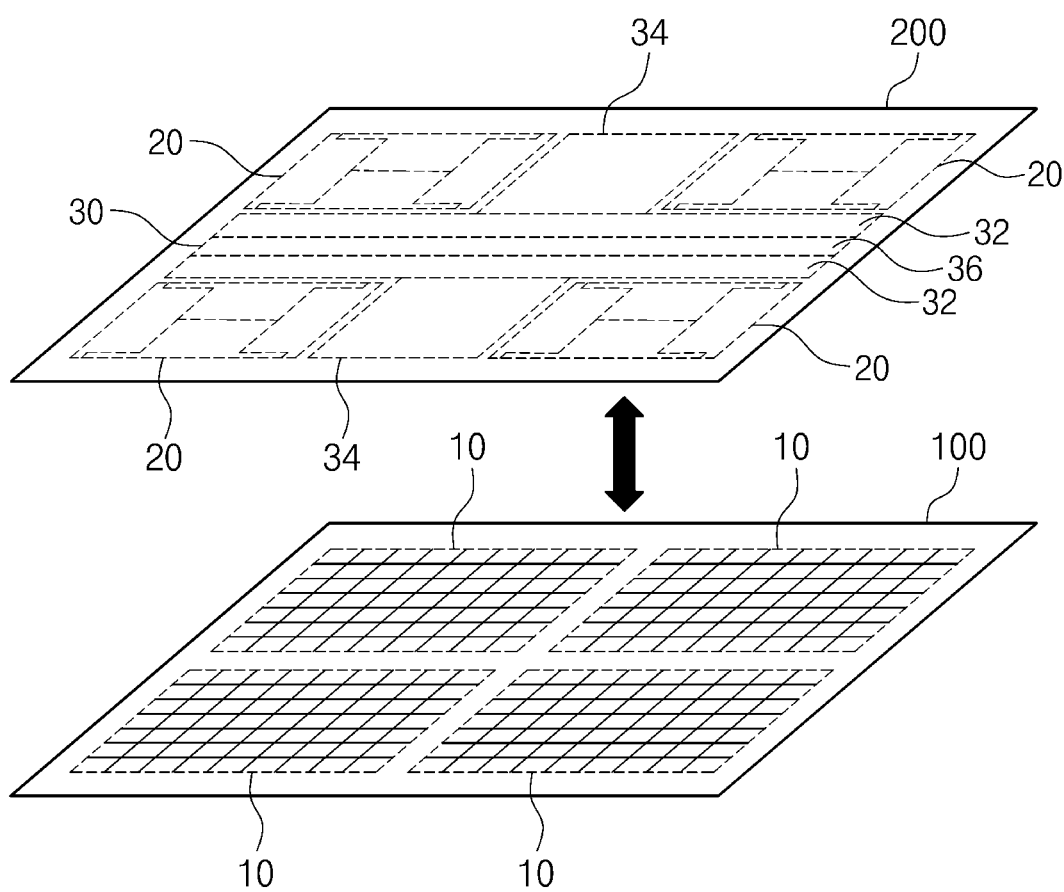
FIG. 13 is a conceptual diagram illustrating a semiconductor memory device, according to an example embodiment of the inventive concept.
Figure 14:
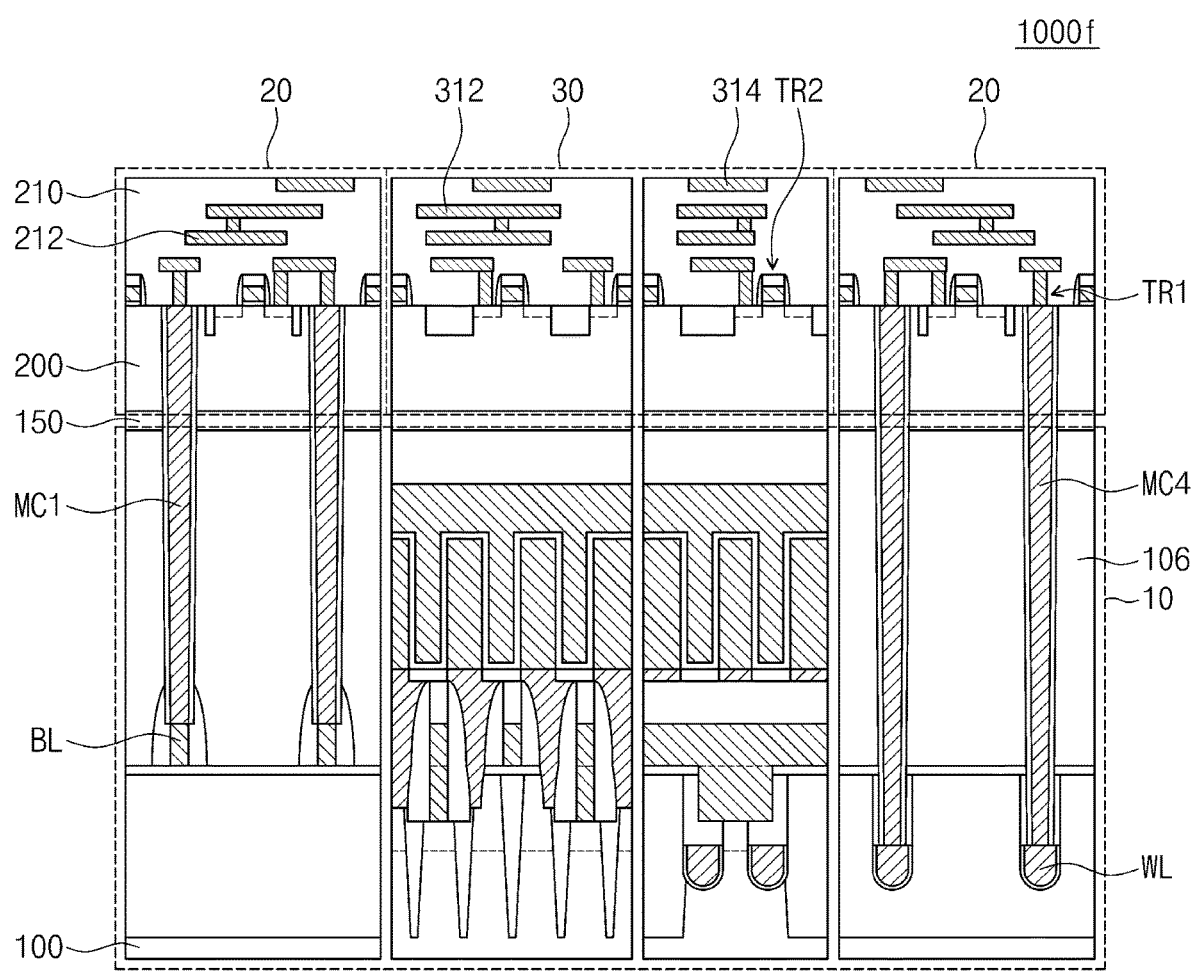
FIG. 14 is a sectional view illustrating a semiconductor memory device, according to an example embodiment of the inventive concept.

FIG. 13 is a conceptual diagram illustrating a semiconductor memory device according to an example embodiment of the inventive concept. FIG. 14 is a sectional view illustrating a semiconductor memory device according to an example embodiment of the inventive concept.

Referring to FIGS. 13 and 14, in a semiconductor memory device 1000f according to the present embodiment, the second substrate 200 may include the core regions 20 and the peripheral circuit region 30. Only the cell array regions 10 may be provided on the first substrate 100. The first transistors TR1 and the first interconnection lines 212 may be disposed on the core regions 20 of the second substrate 200. The second transistors TR2, the second interconnection lines 312, and the second conductive pad 314 may be disposed on the peripheral circuit region 30 of the second substrate 200. The second substrate 200 may be covered with the second interlayered insulating layer 210. End portions of the bit lines BL disposed on the first substrate 100 may be electrically connected to some of the first interconnection lines 212, which are disposed on the core region 20, through the first contact plugs MC1. End portions of the word lines WL disposed in the first substrate 100 may be electrically connected to others of the first interconnection lines 212, which are disposed on the core region 20, through the second contact plug MC2. Except for the afore-described features, the semiconductor memory device 1000f of FIG. 13 may have substantially the same features as that described with reference to FIGS. 2 to 4.

Various arrangements of the cell array regions, the core regions, and the peripheral circuit region of a semiconductor memory device have been described above, but the inventive concept is not limited to these examples. For example, in the embodiments of FIGS. 2, 11, and 13, vertical positions of the substrates 100, 200, and 300 may be changed or inverted.

In a semiconductor memory device according to an example embodiment of the inventive concept, devices of respective circuit regions may be realized on different substrates from each other. Thus, it may be possible to easily realize devices, whose structure and performance are optimized for each circuit region, and to realize a semiconductor memory device with improved reliability. Furthermore, core regions, which correspond to cell array regions, respectively, may be disposed on the cell array regions and thus may have a reduced planar size. Thus, it may be possible to reduce a form factor of the semiconductor memory device. In addition, it may be possible to increase a degree of freedom in designing the semiconductor memory device.

A method of fabricating a semiconductor memory device, according to an example embodiment of the inventive concept, may include forming devices, whose required characteristics are different from each other, on different substrates, stacking the substrates, and connecting the substrates to each other, and this may make it possible to prevent each region from being interfered by other regions. Furthermore, this may make it possible to simplify an overall process of fabricating the semiconductor memory device and to reduce a process failure. In addition, devices can be easily optimized to have electric characteristics required for respective circuit regions.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a first substrate comprising a cell array region;
a first interlayer insulating layer covering the first substrate;
a second substrate disposed on the first interlayer insulating layer, the second substrate comprising a core region electrically connected to the cell array region;
a first adhesive insulating layer interposed between the first interlayer insulating layer and the second substrate; and
first and second contact plugs penetrating the second substrate, the first adhesive insulating layer, and the first interlayer insulating layer and electrically connecting the cell array region with the core region,
wherein bottom surfaces of the first contact plugs are above a top surface of the first substrate, and
wherein bottom surfaces of the second contact plugs are below the top surface of the first substrate.

2. The semiconductor memory device of claim 1, further comprising:
word lines provided on the cell array region to be parallel to each other;
bit lines provided on the cell array region to cross the word lines and to be parallel to each other;
a word line driver provided on the core region to apply an electrical signal to the word lines; and
a sense amplifier provided on the core region to apply an electrical signal to the bit lines,
wherein the first contact plugs connect the sense amplifier to end portions of the bit lines, and
wherein the second contact plugs connect the word line driver to end portions of the word lines.

3. The semiconductor memory device of claim 2,
wherein the word lines are buried in the first substrate, and
wherein the bit lines are provided on the first substrate.

4. The semiconductor memory device of claim 1, wherein the second substrate contacts the first adhesive insulating layer.

5. The semiconductor memory device of claim 1, wherein the second substrate further comprises a peripheral circuit region electrically connected to the core region.

6. The semiconductor memory device of claim 1, further comprising:
a third substrate provided on the second substrate, wherein the third substrate comprises a peripheral circuit region electrically connected to the core region.

7. The semiconductor memory device of claim 6, further comprising:
first transistors disposed on the second substrate; and
second transistors disposed on the third substrate,
wherein the first transistors are low-voltage transistors, and
wherein the second transistors are high-voltage transistors.

8. The semiconductor memory device of claim 7, wherein a density of the first transistors on the second substrate is greater than a density of the second transistors on the third substrate.

9. The semiconductor memory device of claim 6, further comprising:
first transistors disposed on the second substrate; and
second transistors disposed on the third substrate,
wherein the first transistors comprise first gate insulating layers,
wherein the second transistors comprise second gate insulating layers, and
wherein the first gate insulating layers are thinner than the second gate insulating layers.

10. The semiconductor memory device of claim 6, further comprising:
a second interlayer insulating layer covering the second substrate; and
a third interlayer insulating layer covering the third substrate,
wherein the second interlayer insulating layer contacts the third interlayer insulating layer.

11. The semiconductor memory device of claim 10, further comprising:
a first interconnection line disposed in the second interlayer insulating layer;
a second interconnection line disposed in the third interlayer insulating layer; and
a conductive structure penetrating the third substrate, the third interlayer insulating layer, and a portion of the second interlayer insulating layer and contacting both of the first interconnection line and the second interconnection line.

12. The semiconductor memory device of claim 6, further comprising:
a second interlayer insulating layer covering the second substrate;
a second adhesive insulating layer interposed between the second interlayer insulating layer and the third substrate; and
an upper contact plug penetrating the third substrate, the second adhesive insulating layer, and a portion of the second interlayer insulating layer to electrically connect the peripheral circuit region to the core region.

13. A semiconductor memory device, comprising:
a first substrate comprising a cell array region;
word lines provided on the cell array region to be parallel to each other;
bit lines provided on the cell array region to cross the word lines and to be parallel to each other;
a first interlayer insulating layer covering the first substrate;
a second substrate disposed on the first interlayer insulating layer, the second substrate comprising a core region electrically connected to the cell array region;
a first adhesive insulating layer interposed between the first interlayer insulating layer and the second substrate;
contact plugs penetrating the second substrate, the first adhesive insulating layer, and the first interlayer insulating layer and electrically connecting the cell array region with the core region; and
contact insulating layers successively interposed between the contact plugs and the second substrate, between the contact plugs and the first adhesive insulating layer, and between the contact plugs and the first interlayer insulating layer, respectively,
wherein the word lines are buried in the first substrate, and
wherein the bit lines are provided on the first substrate.

14. The semiconductor memory device of claim 13, further comprising:
a word line driver provided on the core region to apply an electrical signal to the word lines; and
a sense amplifier provided on the core region to apply an electrical signal to the bit lines,
wherein the contact plugs comprise:
first contact plugs connecting the sense amplifier to end portions of the bit lines; and
second contact plugs connecting the word line driver to end portions of the word lines.

15. A semiconductor memory device, comprising:
a first substrate comprising a cell array region;
a first interlayer insulating layer covering the first substrate;
a second substrate disposed on the first interlayer insulating layer, the second substrate comprising a core region electrically connected to the cell array region;
a first adhesive insulating layer interposed between the first interlayer insulating layer and the second substrate;
contact plugs penetrating the second substrate, the first adhesive insulating layer, and the first interlayer insulating layer and electrically connecting the cell array region with the core region; and
a third substrate disposed on the second substrate,
wherein the third substrate comprises a peripheral circuit region electrically connected to the core region.

16. The semiconductor memory device of claim 15, further comprising:
first transistors disposed on the second substrate; and
second transistors disposed on the third substrate,
wherein the first transistors are low-voltage transistors, and
wherein the second transistors are high-voltage transistors, wherein a density of the first transistors on the second substrate is greater than a density of the second transistors on the third substrate.

17. The semiconductor memory device of claim 15, further comprising:
first transistors disposed on the second substrate; and
second transistors disposed on the third substrate,
wherein the first transistors comprise first gate insulating layers,
wherein the second transistors comprise second gate insulating layers, and
wherein the first gate insulating layers are thinner than the second gate insulating layers.

18. The semiconductor memory device of claim 15, further comprising:
a second interlayer insulating layer covering the second substrate; and
a third interlayer insulating layer covering the third substrate,
wherein the second interlayer insulating layer contacts the third interlayer insulating layer.

19. The semiconductor memory device of claim 18, further comprising:
a first interconnection line disposed in the second interlayer insulating layer;
a second interconnection line disposed in the third interlayer insulating layer; and
a conductive structure penetrating the third substrate, the third interlayer insulating layer, and a portion of the second interlayer insulating layer and contacting both of the first interconnection line and the second interconnection line.

20. The semiconductor memory device of claim 15, further comprising:
a second interlayer insulating layer covering the second substrate;
a second adhesive insulating layer interposed between the second interlayer insulating layer and the third substrate; and
an upper contact plug penetrating the third substrate, the second adhesive insulating layer, and a portion of the second interlayer insulating layer to electrically connect the peripheral circuit region to the core region.

* * * * *